(12) United States Patent
Sato

(10) Patent No.: US 10,553,768 B2
(45) Date of Patent: Feb. 4, 2020

(54) LIGHT-EMITTING DEVICE

(71) Applicant: NICHIA CORPORATION, Anan-shi, Tokushima (JP)

(72) Inventor: Yoshiki Sato, Anan (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 16/380,601

(22) Filed: Apr. 10, 2019

(65) Prior Publication Data

US 2019/0319176 A1    Oct. 17, 2019

(30) Foreign Application Priority Data

Apr. 11, 2018 (JP) ................... 2018-076096
Feb. 27, 2019 (JP) ................... 2019-033781

(51) Int. Cl.
*H01L 33/60* (2010.01)
*H01L 25/075* (2006.01)
(Continued)

(52) U.S. Cl.
CPC ............ *H01L 33/60* (2013.01); *G02B 6/0073* (2013.01); *H01L 25/0753* (2013.01); *H01L 33/505* (2013.01); *H01L 33/58* (2013.01); *H01L 33/62* (2013.01); *H01L 2933/0033* (2013.01); *H01L 2933/0041* (2013.01); *H01L 2933/0058* (2013.01); *H01L 2933/0066* (2013.01)

(58) Field of Classification Search
CPC ....... H01L 33/60; H01L 33/505; H01L 33/58; H01L 33/62; H01L 25/0753
See application file for complete search history.

(56) References Cited

U.S. PATENT DOCUMENTS 8,097,894 B2 * 1/2012 Bierhuizen ............. H01L 33/46
257/98
10,224,358 B2 * 3/2019 Lu ..................... H01L 27/14629
(Continued)

FOREIGN PATENT DOCUMENTS

JP     2008-108994 A    5/2008
JP     2008-117666 A    5/2008
(Continued)

*Primary Examiner* — Anne M Hines
(74) *Attorney, Agent, or Firm* — Birch, Stewart, Kolasch & Birch, LLP

(57) ABSTRACT

A light-emitting device includes: a light-emitting element which includes an upper surface and a first lateral surface; a light-transmitting member disposed above the light-emitting element, the light-transmitting member having a substantially rectangular shape with a pair of first sides and a pair of second sides; a wavelength conversion member having a plurality of lateral surfaces; and a reflecting member. The light-transmitting member has a pair of second lateral surfaces each including a corresponding one of the first sides, and a pair of third lateral surfaces each including a corresponding one of the second sides. The reflecting member covers the first lateral surface, an entirety of the plurality of lateral surfaces of the wavelength conversion member, and an entirety of the pair of second lateral surfaces of the light-transmitting member. Each of the pair of third lateral surfaces of the light-transmitting member is partially exposed out of the reflecting member.

18 Claims, 18 Drawing Sheets

(51) Int. Cl.
*H01L 33/50* (2010.01)
*H01L 33/58* (2010.01)
*F21V 8/00* (2006.01)
*H01L 33/62* (2010.01)

(56) References Cited

U.S. PATENT DOCUMENTS

| | | |
|---|---|---|
| 2010/0085772 A1 | 4/2010 | Song et al. |
| 2012/0262054 A1* | 10/2012 | Ooyabu ................. H01L 33/56 |
| | | 313/498 |
| 2016/0095184 A1* | 3/2016 | Nakabayashi ......... H05B 33/22 |
| | | 313/503 |
| 2017/0098743 A1 | 4/2017 | Chen et al. |
| 2017/0110635 A1* | 4/2017 | Ito ......................... H01L 33/507 |
| 2017/0154880 A1 | 6/2017 | Ozeki et al. |
| 2017/0222107 A1 | 8/2017 | Chen et al. |
| 2017/0294419 A1 | 10/2017 | Nakabayashi et al. |
| 2017/0365743 A1* | 12/2017 | You ....................... H01L 33/486 |

FOREIGN PATENT DOCUMENTS

| | | |
|---|---|---|
| JP | 2010-93226 A | 4/2010 |
| JP | 2013-127994 A | 6/2013 |
| JP | 2013-127995 A | 6/2013 |
| JP | 2013-127996 A | 6/2013 |
| JP | 2016-181653 A | 10/2016 |
| JP | 2017-108092 A | 6/2017 |
| JP | 2017-108111 A | 6/2017 |
| JP | 2017-168819 A | 9/2017 |
| JP | 2017-188589 A | 10/2017 |
| WO | WO 2011/122530 A1 | 10/2011 |
| WO | WO 2011/122531 A1 | 10/2011 |

\* cited by examiner

LIGHT-EMITTING DEVICE

CROSS-REFERENCE TO RELATED APPLICATION

This application claims priority to Japanese Patent Application No. 2018-076096, filed on Apr. 11, 2018, and Japanese Patent Application No. 2019-033781, filed on Feb. 27, 2019, the disclosures of which are hereby incorporated by reference in their entireties.

BACKGROUND

The present disclosure relates to a light-emitting device.

Semiconductor light-emitting elements, typically LED, have been widely used for a light source for display devices. Japanese Patent Publication No. 2008-108994 and Japanese Patent Publication No. 2010-093226 describe light-emitting devices in which a LED chip is disposed in a recess of a package and the recess is filled with a light-transmitting resin.

SUMMARY

There has been a demand for a light-emitting device which has wide directivity in a predetermined direction but narrow directivity in another predetermined direction.

A light-emitting device of an embodiment of the present disclosure includes: a light-emitting element which includes an upper surface and a first lateral surface; a light-transmitting member disposed above the upper surface of the light-emitting element, the light-transmitting member having a substantially rectangular shape with a pair of first sides substantially parallel to each other and a pair of second sides substantially parallel to each other and substantially perpendicular to the first sides in a top view; a wavelength conversion member disposed between the light-emitting element and the light-transmitting member, the wavelength conversion member having a plurality of lateral surfaces; and a reflecting member, in which the light-transmitting member has a pair of second lateral surfaces each including a corresponding one of the first sides of the rectangular shape of the light-transmitting member, and a pair of third lateral surfaces each including a corresponding one of the second sides of the rectangular shape of the light-transmitting member, the reflecting member covers the first lateral surface of the light-emitting element, an entirety of the plurality of lateral surfaces of the wavelength conversion member, and an entirety of the pair of second lateral surfaces of the light-transmitting member, and each of the pair of third lateral surfaces of the light-transmitting member is partially exposed out of the reflecting member.

A light-emitting device of another embodiment of the present disclosure includes: a light-emitting element which has an upper surface and a first lateral surface; a light-transmitting member disposed above the upper surface of the light-emitting element, the light-transmitting member having a substantially rectangular shape with a pair of first sides substantially parallel to each other and a pair of second sides substantially parallel to each other and substantially perpendicular to the first sides in a top view; a wavelength conversion member disposed between the light-emitting element and the light-transmitting member; and a reflecting member, in which the light-transmitting member includes: a pair of second lateral surfaces each including a corresponding one of the first sides of the rectangular shape of the light-transmitting member, and a pair of third lateral surfaces each including a corresponding one of the second sides of the rectangular shape of the light-transmitting member, the wavelength conversion member includes: a pair of fourth lateral surfaces which are parallel to the second lateral surfaces of the light-transmitting member, and a pair of fifth lateral surfaces which are parallel to the third lateral surfaces of the light-transmitting member, the reflecting member covers the first lateral surfaces of the light-emitting element and an entirety of the second lateral surfaces of the light-transmitting member, the third lateral surfaces of the light-transmitting member, the fourth lateral surfaces of the wavelength conversion member and the fifth lateral_surfaces of the wavelength conversion member, and the reflecting member includes a first portion covering the third lateral surfaces of the light-transmitting member, and a second portion covering the fifth lateral surfaces of the wavelength conversion member, the first portion having a thickness smaller than a thickness of the second portion, and the second portion has an upper surface located outward of the first portion.

According to an embodiment of the present disclosure, a light-emitting device is provided in which the distribution of light is enlarged in one of two directions, e.g., directivity that are perpendicular to each other.

DETAILED DESCRIPTION

Figure 1:
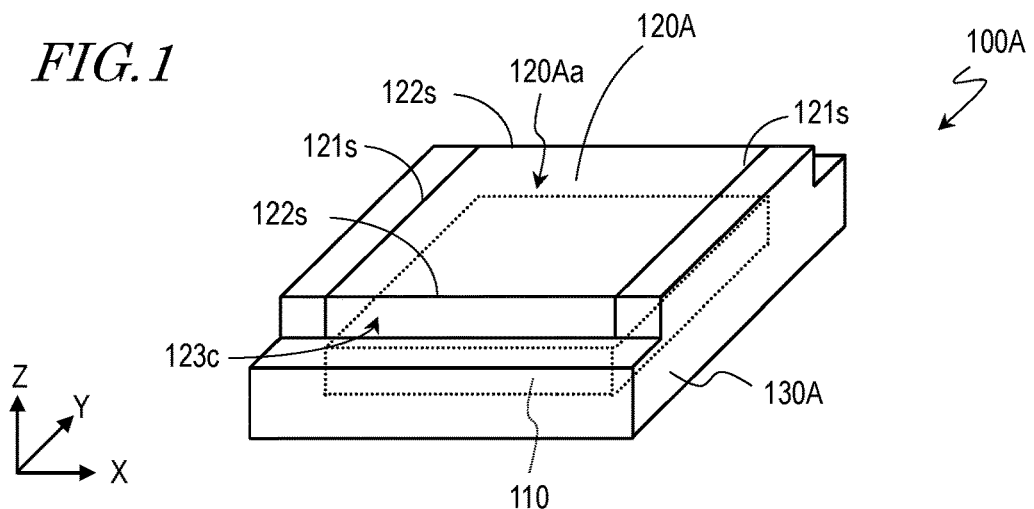
FIG. 1 is a schematic perspective view showing a light-emitting device of the first embodiment of the present disclosure.

Hereinafter, certain embodiments of the present disclosure will be described in detail with reference to the drawings. The embodiments which will be described below are examples, and a light-emitting device of the present disclosure is not limited to those described in the embodiments that will be described below. For example, values, shapes, materials, steps and the order of steps which will be shown in the embodiments described below are examples, and various modifications thereto are possible so long as no technical inconsistency occurs.

The dimensions and sizes of components shown in the drawings may be exaggerated for ease of understanding, so that the dimensions, shapes, and relative sizes of components in an actual light-emitting device may not correspond to those in the drawings. To avoid excessively complicated drawings, some components may not be shown in the drawings.

In the following description, components which have substantially the same function are designated by the same reference numeral, and the duplicative description thereof may be omitted. In the description below, the terms which designate specific directions or positions (e.g., "upper", "lower", "right", "left", and other terms including such terms) are sometimes used. Such terms are used for ease of understanding of relative directions or positions in the referred drawings. In drawings other than drawings of the present disclosure, actual products, or manufacturing devices, arrangements of corresponding components may not be the same as those shown in the drawings referred to in the present disclosure, so long as the relationship of relative directions or positions designated by terms such as "upper", "lower", etc., thereof is the same as those in the drawings referred to in the present disclosure. In the present disclosure, "parallel" includes the cases where two lines, sides or planes are at an angle in the range of approximately 0°±5° unless otherwise specified. In the present disclosure, "vertical" or "perpendicular" includes the cases where two lines, sides or planes are at an angle in the range of approximately 90°±5° from unless otherwise specified.

First Embodiment

Figure 2:
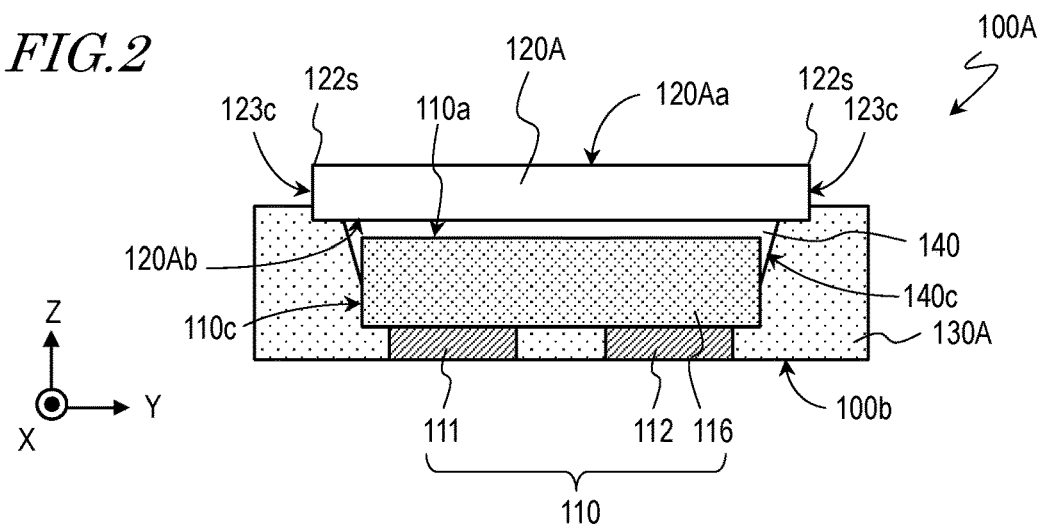
FIG. 2 is a schematic cross-sectional view of the light-emitting device 100A shown in FIG. 1 taken along a plane parallel to the YZ plane.
Figure 3:
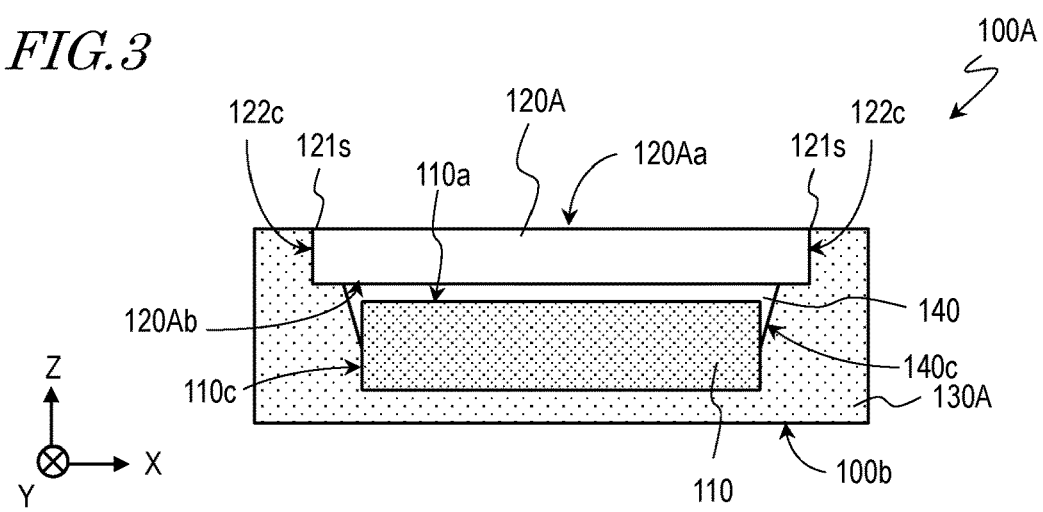
FIG. 3 is a schematic cross-sectional view of the light-emitting device 100A shown in FIG. 1 taken along a plane parallel to the ZX plane.

FIG. 1, FIG. 2, and FIG. 3 show a light-emitting device of the first embodiment of the present disclosure. For the sake of reference, arrows indicative of X-direction, Y-direction and Z-direction, which are perpendicular to one another, are also shown in FIG. 1, FIG. 2, and FIG. 3. In some of the other drawings of the present disclosure, arrows indicative of these directions are shown.

The light-emitting device 100A shown in FIG. 1, FIG. 2, and FIG. 3 generally include a light-emitting element 110, a light-transmitting member 120A and a reflecting member 130A. As schematically shown in FIG. 2 and FIG. 3, in this example, the light-emitting device 100A further includes a light guiding member 140. A portion of the light guiding member 140 is located between a lower surface 120Ab of the light-transmitting member 120A and an upper surface 110a (first upper surface) of the light-emitting element 110. FIG. 2 and FIG. 3 are schematic cross-sectional views of the light-emitting device 100A taken along a plane perpendicular to the upper surface 120Aa of the light-transmitting member 120A at a position near the center of the light-emitting device 100A. The cross section shown in FIG. 2 is a cross section of the light-emitting device 100A taken parallel to the YZ plane. The cross section shown in FIG. 3 is a cross section of the light-emitting device 100A taken parallel to the ZX plane. As shown in the drawings, the light guiding member 140 can include a portion which is located on lateral surfaces 110c (i.e., first lateral surfaces) of the light-emitting element 110.

The light-transmitting member 120A is a plate-like member which is located above the upper surface 110a of the light-emitting element 110. The light-transmitting member 120A has a rectangular shape in a top view. Herein, as schematically shown in FIG. 1, the upper surface 120Aa of the light-transmitting member 120A is square when viewed from the top. In this specification, the expression "rectangular" refers to a quadrilateral shape formed by four sides and includes, for example, an oblong-rectangular shape and a square shape.

In the configuration illustrated in FIG. 1, FIG. 2 and FIG. 3, the rectangular shape of the upper surface 120Aa is formed by a pair of first sides 121s which are parallel to each other and a pair of second sides 122s which are parallel to each other and perpendicular to the first sides 121s. In the present embodiment, the first sides 121s and the second sides 122s are parallel to the Y-direction and the X-direction, respectively, and the length of the first sides 121s is equal to the length of the second sides 122s.

As shown in FIG. 3, the light-transmitting member 120A has two lateral surfaces 122c (i.e., second lateral surfaces), each of which is parallel to the YZ plane and each of which includes the first sides 121s. The light-transmitting member 120A also has two lateral surfaces 123c (i.e., third lateral surfaces), each of which is parallel to the ZX plane and each of which includes the second sides 122s as shown in FIG. 2. As can be understood from the comparison between FIG. 2 and FIG. 3, the reflecting member 130A covers the lateral surfaces 110c of the light-emitting element 110 and an entirety of the two lateral surfaces 122c of the light-transmitting member 120A, while a portion of each of the two lateral surfaces 123c of the light-transmitting member 120A is exposed out of the reflecting member 130A.

The reflecting member 130A is made of, for example, a resin material in which a reflective filler is dispersed and has a reflectance of, for example, 60% or more of light having the emission peak wavelength of the light-emitting element 110. Therefore, light emitted from the light-emitting element 110 is, generally, extracted from the light-emitting device 100A via the light-transmitting member 120A. Herein, a portion of each of the two lateral surfaces 123c of the light-transmitting member 120A is exposed out of the reflecting member 130A. Therefore, light can be extracted not only from the upper surface 120Aa of the light-transmitting member 120A but also from each of the lateral surfaces 123c. Thus, light distribution in the extending direction of the first sides 121s wider than light distribution in the extending direction of the second sides 122s can be obtained. That is, in the YZ plane, the range of the emission angle of light which has an intensity equal to or higher than a predetermined intensity relative to the normal of the upper surface 120Aa can be increased as compared with the light distribution in the ZX plane. Thus, according to one embodiment of the present disclosure, for example, light distribution in the extending direction of the first sides 121s can be widen while light distribution in the extending direction of the second sides 122s is narrow.

Hereinafter, respective components are described in detail.

Light-Emitting Element 110

The light-emitting element 110 is a known semiconductor light-emitting element, such as LED (Light-emitting Diode). In the example illustrated in the drawings, the light-emitting element 110 includes an element body 116 and a first electrode 111 and a second electrode 112 which are disposed opposite to the upper surface 110a. In this example, the upper surface of the element body 116 forms the upper surface 110a of the light-emitting element 110. In a top view, the light-emitting element 110 generally has a rectangular shape. Therefore, the light-emitting element 110 has four lateral surfaces 110c.

The element body 116 includes, for example, a supporting substrate such as sapphire substrate, gallium nitride substrate, or the like, and a semiconductor multilayer structure on the supporting substrate. The semiconductor multilayer structure includes an active layer, an n-type semiconductor layer and a p-type semiconductor layer.
The active layer is disposed between the n-type semiconductor layer and the p-type semiconductor layer. The first electrode 111 and the second electrode 112 are electrically connected with the n-type semiconductor layer and the p-type semiconductor layer, respectively. The semiconductor multilayer structure can include a nitride semiconductor ($In_xAl_yGa_{1-x-y}N$, $0 \le x$, $0 \le y$, $x+y \le 1$) configured to emit light in the range of ultraviolet to visible light. In the description below, a LED configured to emit blue light is illustrated as the light-emitting element 110.

Light-Transmitting Member 120a

The light-transmitting member 120A covers the light-emitting element 110 and functions as a protection layer for the light-emitting element 110. The light-transmitting member 120A is made of, for example, a resin composition containing a silicone resin or the like as a base material. The light-transmitting member 120A generally has a transmittance of 60% or more for light having the emission peak wavelength of the light-emitting element 110. In view of effectively utilizing light, the light-transmitting member 120A advantageously has a transmittance at the emission peak wavelength of the light-emitting element 110 of 70% or more, and more advantageously that of 80% or more.

Examples of the base material of the light-transmitting member 120A include, besides silicone resins, a modified silicone resin, an epoxy resin, a phenolic resin, a polycarbonate resin, an acrylic resin, a polymethylpentene resin, a polynorbornene resin, or a material containing two or more of these resins. A material having a refractive index different from that of the base material may be dispersed in the base material such that the light-transmitting member 120A has a light diffusing function. In this specification, the expression "light-transmitting" includes being diffusive for incident light and is not limited to being "transparent". The light-transmitting member 120A may be made of glass.

Reflecting Member 130A

As described above, the reflecting member 130A is made of, for example, a resin material in which a reflective filler is dispersed and is adapted to reflect incident light. The reflecting member 130A has a reflectance of, for example, 60% or more of light having the emission peak wavelength of the light-emitting element 110. The reflectance of the reflecting member 130A at the emission peak wavelength of the light-emitting element 110 may be 70% or more, or may be 80% or more.

Examples of the base material in which the reflective filler is to be dispersed include silicone resins, modified silicone resins, epoxy resins, modified epoxy resins, urea resins, phenolic resins, acrylic resins, urethane resins, fluoric resins, or a resin containing two or more of these resins. As the reflective filler, metal particles, or particles of an inorganic or organic material which has a higher refractive index than the base material, can be used. Examples of the reflective filler include particles of titanium dioxide, zirconium dioxide, potassium titanate, aluminum oxide, aluminum nitride, boron nitride, mullite, niobium oxide, barium sulfate, silicon oxide, and rare earth oxides (e.g., yttrium oxide, gadolinium oxide).

As shown in FIG. 2 and FIG. 3, the reflecting member 130A covers the four lateral surfaces 110c of the light-emitting element 110. In this specification, the term "cover" encompasses not only direct physical contact between a member to be covered and a covering member but also a case in which another member is disposed between a member to be covered and a covering member. In this example, the light guiding member 140 is disposed between the lateral surface 110c of the light-emitting element 110 and the reflecting member 130A, while the reflecting member 130A covers an entirety of the outer surfaces 140c of the light guiding member 140. Thus, the four lateral surfaces 110c of the light-emitting element 110 are entirely covered with the reflecting member 130A.

Figure 4:
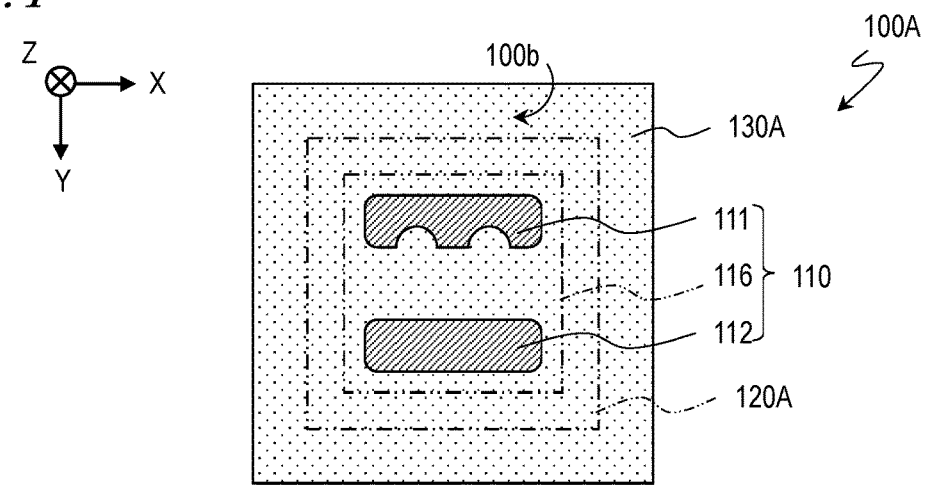
FIG. 4 is a schematic plan view showing a lower surface 100b of the light-emitting device 100A.

As illustrated in FIG. 2 and FIG. 3, the reflecting member 130A may cover not only the lateral surface 110c of the light-emitting element 110 but also a surface of the light-emitting element 110 opposite to the upper surface 110a. FIG. 4 shows an example of the lower surface 100b of the light-emitting device 100A. In this example, as shown in FIG. 4, the reflecting member 130A covers a side opposite to the upper surface 110a of the light-emitting element 110, and the lower surface of the first electrode 111 and the second electrode 112 is exposed out of the reflecting member 130A at the lower surface 100b. Of the lower surface 100b of the light-emitting device 100A, a portion exclusive of the first electrode 111 and the second electrode 112 is occupied by the reflecting member 130A. Thus, emission of light from the lower surface 100b side of the light-emitting device 100A can be reduced, and the effect of improving the light utilization efficiency can be obtained.

With the lower surface of the first electrode 111 and the lower surface of the second electrode 112 that are exposed out of the reflecting member 130A, the light-emitting device 100A can easily be mounted to a wiring board or the like in a flip chip bonding manner. As illustrated in FIG. 4, a portion of the first electrode 111 exposed out of the reflecting member 130A and a portion of the second electrode 112 exposed out of the reflecting member 130A have shapes different from each other, so that the first electrode 111 and the second electrode 112, one of which is a cathode and the other of which is an anode, can be easily distinguished from each other.

Figure 5:
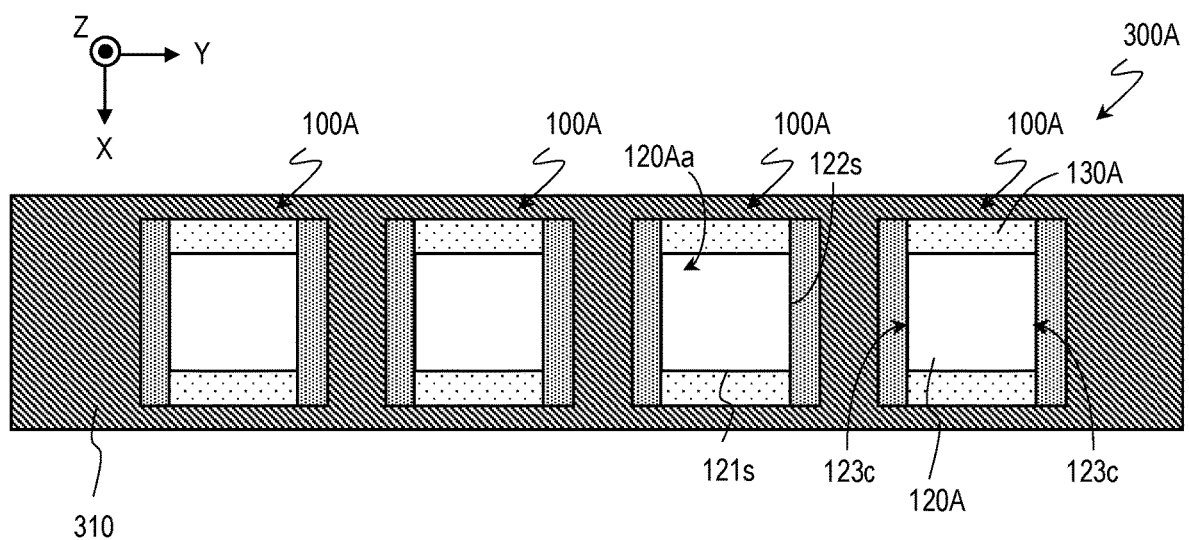
FIG. 5 is an exemplary plan view schematically showing a plurality of light-emitting devices mounted on a wiring board.

FIG. 5 shows a plurality of light-emitting devices 100A mounted on a wiring board. The light source device 300A shown in FIG. 5 includes a wiring board 310 and four light-emitting devices 100A aligned on the wiring board 310. For ease of understanding, in FIG. 5, a densely hatched portion represents a portion, located relatively lower, of the upper surface of the reflecting member 130A of each of the light-emitting devices 100A.

As illustrated in FIG. 5, the plurality of light-emitting devices 100A are arranged along the extending direction of the first sides 121s of the upper surface 120Aa. With this arrangement, the distribution of light can be widen in the arrangement direction of the plurality of light-emitting devices 100A while the distribution of light is narrow in a direction perpendicular to the arrangement direction of the plurality of light-emitting devices 100A. Therefore, for example, the intervals between the light-emitting devices 100A can be increased as compared with a case where all the lateral surfaces of the light-transmitting member 120A are entirely covered with the reflecting member.

Light Guiding Member 140

Description below will be given with reference to FIG. 2 and FIG. 3. The light guiding member 140 is a light-transmitting structure which includes at least a portion located on the lateral surface 110c of the light-emitting element 110. The light guiding member 140 has the outer surfaces 140c that is the interface with the reflecting member 130A. As shown in the drawings, typically, the light guiding member 140 further includes a portion which is located between the upper surface 110a of the light-emitting element 110 and the lower surface 120Ab of the light-transmitting member 120A.

The material of the light guiding member 140 can be a resin composition which contains a transparent resin material as the base material. For the base material of the light guiding member 140, a material as those used for the base material of the light-transmitting member 120A can be used. The light guiding member 140 has a transmittance of 60% or more of light having the emission peak wavelength of the light-emitting element 110, as in the light-transmitting member 120A. For example, a material having a refractive index different from that of the base material may be dispersed in the base material such that the light guiding member 140 is light-diffusive. For effectively utilizing light, the transmittance of the light guiding member 140 at the emission peak wavelength of the light-emitting element 110 is advantageously 70% or more, and more advantageously 80% or more.

As shown in the drawings, the light guiding member 140 includes a portion which is located between the lateral surfaces 110c of the light-emitting element 110 and the reflecting member 130A. With the light guiding member 140, of light emitted from the light-emitting element 110, light emitted from the lateral surface 110c of the light-emitting element 110 can be partially incident on the light guiding member 140. The light incident on the light guiding member 140 is reflected at the outer surface 140c of the light guiding member 140 to a region above the light-emitting element 110, and thus is emitted from the light-emitting device 100A via the light-transmitting member 120A. Thus, with the light guiding member 140, the light extraction efficiency can be improved. The light guiding member 140 may cover an entirety of a region between the lower end and the upper end the element body 116. Covering a larger area of the lateral surface 110c of the light-emitting element 110 with the light guiding member 140 allows for increasing light guided to a region above the light-emitting element 110, and thus is preferable.

In a cross-sectional view, each of the outer surfaces 140c is not limited to be shown as a straight line such as shown in FIG. 2 and FIG. 3. In a cross-sectional view, each of the outer surfaces 140c may be shown as a polygonal line, a curve which is convex in a direction toward the light-emitting element 110 or a curve which is convex in a direction away from the light-emitting element 110. With the light guiding member 140 having the outer surface 140c that is curved to be convex in a direction away from the light-emitting element 110, a larger portion of light emitted from the lateral surface 110c of the light-emitting element 110 and transmitted through the light guiding member 140 can be more efficiently guided to the upper surface side of the light-emitting device 100A. Therefore, the light extraction efficiency can be improved more advantageously.

As described above, the reflecting member 130A covers an entirety of the two lateral surfaces 122c of the light-transmitting member 120A and covers a portion of each of the two lateral surfaces 123c that are perpendicular to the lateral surfaces 122c. Meanwhile, the reflecting member 130A may not cover a portion of each of the lateral surfaces 123c of the light-transmitting member 120A.

Figure 6:
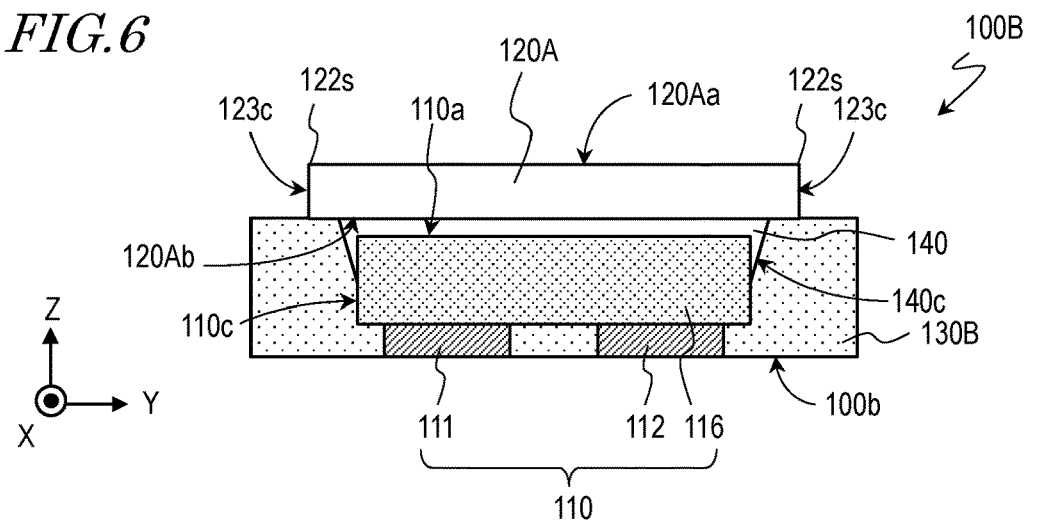
FIG. 6 is a schematic cross-sectional view showing a variant example of the light-emitting device of the first embodiment of the present disclosure.

FIG. 6 shows a variant example of the light-emitting device of the first embodiment of the present disclosure. FIG. 6 schematically shows a cross section of the light-emitting device taken along a plane parallel to the YZ plane at a position near the center of the light-emitting device, as in FIG. 2.

The light-emitting device 100B shown in FIG. 6 includes a reflecting member 130B instead of the reflecting member 130A, as compared with the above-described light-emitting device 100A described above. In the example shown in FIG. 6, the two lateral surfaces 123c of the light-transmitting member 120A are entirely exposed out of the reflecting member 130B. With the two lateral surfaces 123c entirely exposed out of the reflecting member 130B, the distribution of light in the extending direction of the first sides 121s, in other words, the distribution of light in the YZ plane, can be effectively widened.

Figure 7:
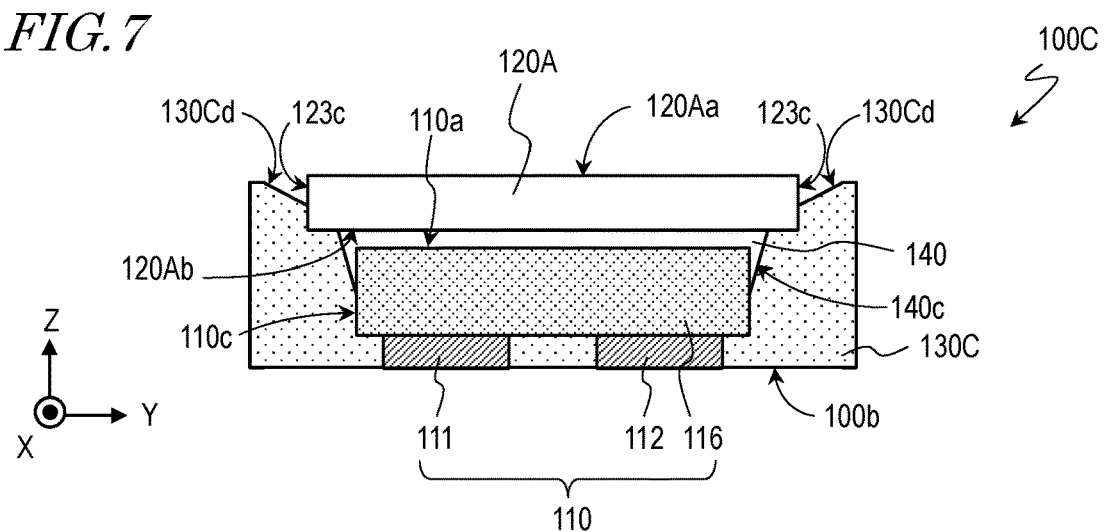
FIG. 7 is a schematic cross-sectional view showing another variant example of the light-emitting device of the first embodiment of the present disclosure.

FIG. 7 shows another variant example of the light-emitting device of the first embodiment of the present disclosure. The light-emitting device 100C shown in FIG. 7 includes a reflecting member 130C which has reflecting surfaces 130Cd at a side opposite to the lower surface 100b of the light-emitting device 100C. The reflecting surfaces 130Cd face a region of each of the lateral surfaces 123c of the light-transmitting member 120A which are exposed out of the reflecting member 130C, and are inclined with respect to the lateral surfaces 123c.

As illustrated in FIG. 7, with the reflecting member 130C having the reflecting surfaces 130Cd that face the lateral surfaces 123c of the light-transmitting member 120A, light emitted from the lateral surfaces 123c of the light-transmitting member 120A is reflected by the reflecting surfaces 130Cd such that the traveling direction of the light can be changed to a direction toward a region above the light-emitting device 100C. That is, the light extraction efficiency can be improved. For example, when a light guide plate is disposed so as to face the upper surface 120Aa of the light-transmitting member 120A, a larger amount of light can be guided into the light guide plate using reflection at the reflecting surfaces 130Cd of the reflecting member 130C.

Figure 8:
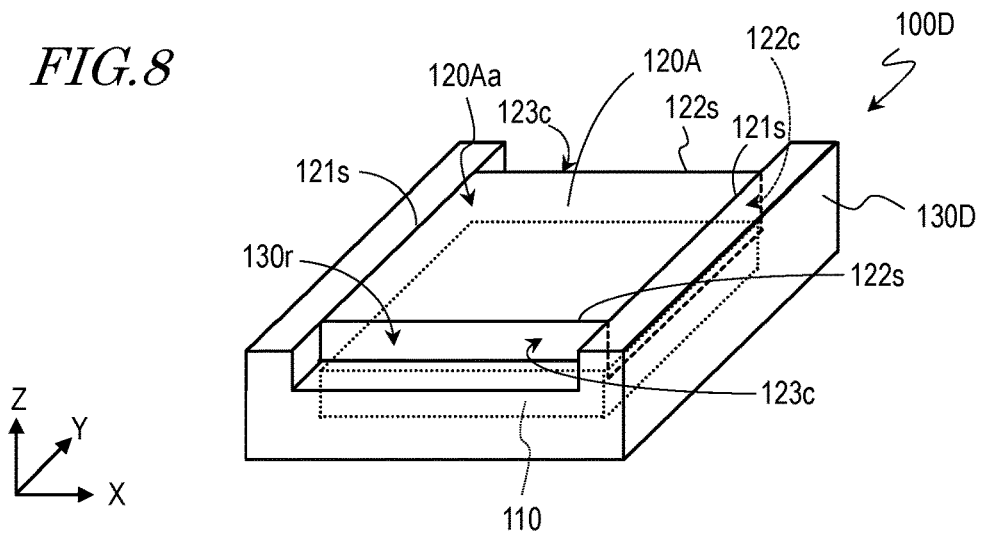
FIG. 8 is a perspective view showing still another variant example of the light-emitting device of the first embodiment of the present disclosure.

FIG. 8 shows still another variant example of the light-emitting device of the first embodiment of the present disclosure. The light-emitting device 100D shown in FIG. 8 includes a reflecting member 130D. The reflecting member 130D and the light-transmitting member 120A define recesses 130r at opposite sides of the light-transmitting member 120A in the extending direction of the first sides 121s. In other words, portions of the reflecting member 130D each covering a respective one of the lateral surfaces 122c of the light-transmitting member 120A include portions extending outward of the lateral surfaces 123c in the positive and negative directions on the Y-axis.

In this example, a portion of each of the lateral surfaces 123c of the light-transmitting member 120A is exposed from the reflecting member 130D at the recesses 130r. As in the example shown in FIG. 8, also with the reflecting member 130D having a shape in which the upper surface is partially recessed, a light distribution widened in the extending direction of the first sides 121s can be obtained as in the examples described above. Each of the two lateral surfaces 123c may be entirely exposed out of the reflecting member 130D at the recess 130r.

Figure 9:
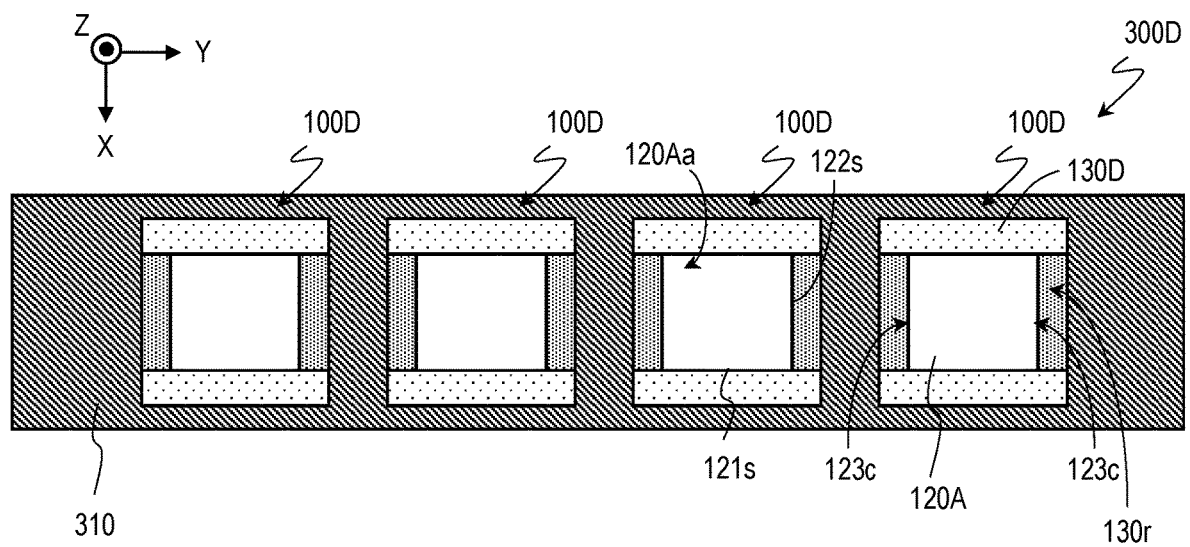
FIG. 9 is a schematic plan view showing another example of a light source device in which four light-emitting devices are mounted to a wiring board.

FIG. 9 shows a light source device 300D which includes four light-emitting devices 100D mounted on the wiring board 310. In FIG. 9, densely hatched portions represents recesses 130r in the upper surface of the reflecting member 130D. As in the example described with reference to FIG. 5, the plurality of light-emitting devices 100D are arranged along the extending direction of the first sides 121s of the upper surface 120Aa, which allows for widening light distribution in the arrangement direction of the plurality of light-emitting devices 100D.

Other Variant Examples

In each of the above-described examples, the upper surface 120Aa of the light-transmitting member 120A has a substantially square shape in a top view. The upper surface 120Aa may have any appropriate shape other than the substantially square shape in a top view.

Figure 10:
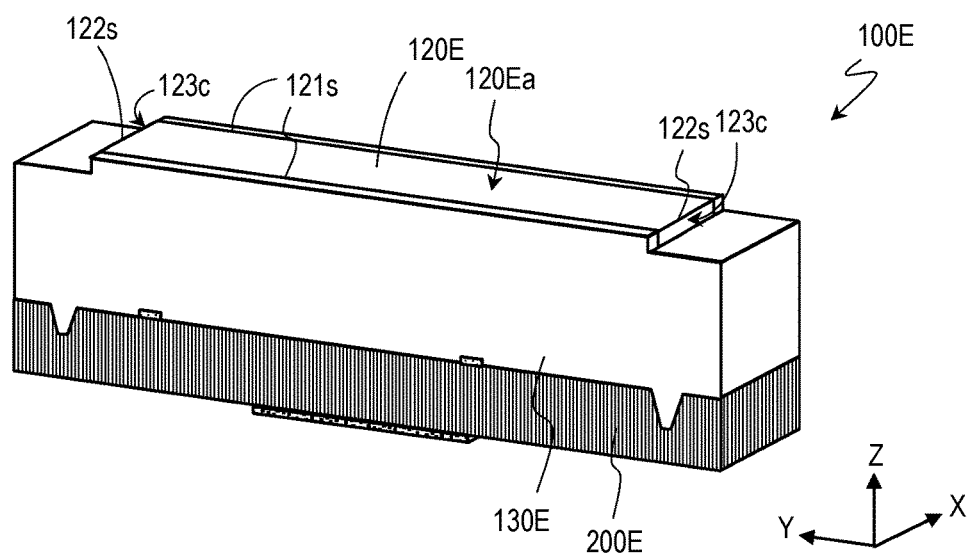
FIG. 10 is a perspective view showing an example of a light-emitting device including a light-transmitting member which has an oblong rectangular shape in a top view.
Figure 11:
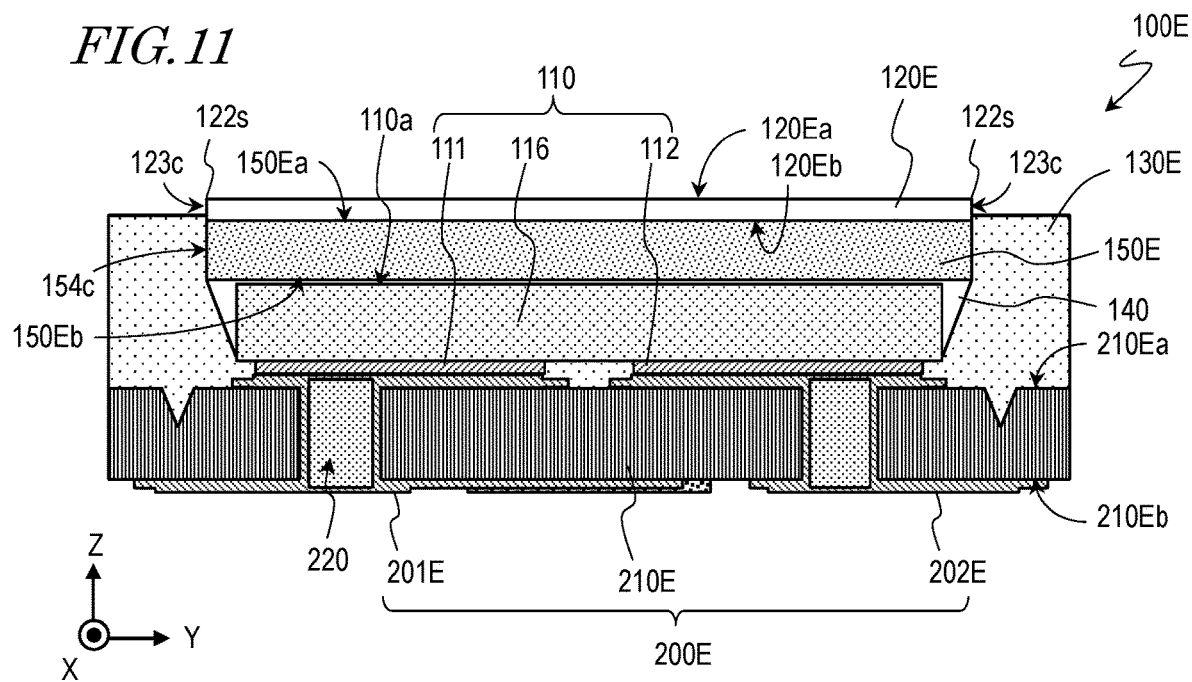
FIG. 11 is a schematic cross-sectional view of the light-emitting device 100E shown in FIG. 10 taken along a plane parallel to the YZ plane at a position near the center of the light-emitting device 100E.

FIG. 10 shows an example of a light-emitting device including a light-transmitting member which has an oblong rectangular shape in a top view. FIG. 11 schematically shows a cross section of the light-emitting device 100E shown in FIG. 10 taken along a plane parallel to the YZ plane at a position near the center of the light-emitting device 100E.

In comparison with the light-emitting device 100A shown in FIG. 1, the light-emitting device 100E shown in FIG. 10 and FIG. 11 includes a light-transmitting member 120E instead of the light-transmitting member 120A. The light-transmitting member 120E has an upper surface 120Ea which has an oblong rectangular shape in a top view. As shown in FIG. 10, the light-emitting device 100E has an outer shape longer in the Y-direction than in the X-direction. In this example, of the sides forming the oblong rectangular shape of the upper surface 120Ea, the two first sides 121s are the long sides of the oblong rectangular shape, and the two second sides 122s are the short sides of the oblong rectangular shape.

According to the shape of the light-transmitting member 120E longer in the Y-direction than in the X-direction, the light-emitting device 100E includes a reflecting member 130E having a shape longer in the Y-direction than in the X-direction. The lateral surfaces 123c of the light-transmitting member 120E are at least partially exposed out of the reflecting member 130E as in the light-emitting device 100A described above.

Descriptions below will be given with reference to FIG. 11. The cross section shown in FIG. 11 is a cross section of the light-emitting device 100E taken along a plane parallel to the YZ plane at a position near the center of the light-emitting device 100E. In this example, the element body 116 of the light-emitting element 110 has a shape which is longer in the Y-direction than in the X-direction, similarly to the light-transmitting member 120E. As shown in FIG. 11, the light-emitting device 100E further includes a wavelength conversion member 150E disposed between the upper surface 110a of the light-emitting element 110 and the lower surface 120Eb of the light-transmitting member 120E.

Wavelength Conversion Member 150E

The wavelength conversion member 150E is generally a plate-like member in which phosphor particles are dispersed in a resin and which has a thickness of, for example, approximately 100 μm. The wavelength conversion member 150E is adapted to absorb at least a portion of light emitted from the light-emitting element 110 and to emit light of a different wavelength from that of the light emitted from the light-emitting element 110. For example, the wavelength conversion member 150E is adapted to convert the wavelength of a portion of blue light emitted from the light-emitting element 110 to emit yellow light. With such a configuration, blue light which has passed through the wavelength conversion member 150E and the yellow light emitted from the wavelength conversion member 150E are mixed together, so that white light is obtained.

In the configuration illustrated in FIG. 11, the wavelength conversion member 150E has an upper surface 150Ea (i.e., second upper surface), a lower surface 150Eb which is opposite to the upper surface 150Ea, and lateral surfaces 154c (i.e., fourth lateral surfaces) between the upper surface 150Ea and the lower surface 150Eb. The four lateral surfaces 154c of the wavelength conversion member 150E include two lateral surfaces 154c each of which is generally in the same plane as a respective one of the lateral surfaces 123c of the light-transmitting member 120E. In this example, the reflecting member 130E covers substantially an entirety of two lateral surfaces 154c that are parallel to the ZX plane and covers substantially an entirety of two lateral surfaces 154c that are parallel to the YZ plane, which are not shown in FIG. 11. With the reflecting member 130E covering substantially an entirety of the lateral surfaces 154c, light traveling from the inside of the wavelength conversion member 150E to the lateral surfaces 154c can be reflected at the lateral surfaces 154c to return to the wavelength conversion member 150E. Accordingly, a relative intensity of a portion of light emitted at a relatively large emission angle with respect to the normal of the upper surface 120Ea of the light-transmitting member 120E that is not wavelength-converted can be reduced, so that the color temperature of obtained white light can be reduced. That is, even in a region at a relatively large emission angle, wavelength-converted light and light which has passed through the wavelength conversion member 150E are mixed more securely, so that bluishness in the emitted light can be reduced, so that unevenness in emission color in the extending direction of the first sides 121s can be reduced.

In view of suppressing unevenness in emission color in the extending direction of the first sides 121s, the reflecting member 130E advantageously covers an entirety of the lateral surfaces 154c. On the other hand, the reflecting member 130E may not cover an entirety of the lateral surfaces 154c, and approximately 3% or less of an area of each of the lateral surfaces 154c may be exposed in a direction from the upper surface 150Ea to the lower surface 150Eb of the wavelength conversion member 150E. That is, with the reflecting member 130E covering 97% or more of the lateral surfaces 154c of the wavelength conversion member 150E in a direction from the lower surface 150Eb to the upper surface 150Ea of the wavelength conversion member 150E, the effect of reducing unevenness in emission color in the extending direction of the first sides 121s can be obtained.

For the wavelength conversion member 150E, a resin composition in which particles of a phosphor which is a wavelength converting substance are dispersed can be used. Examples of the resin in which the phosphor particles are to be dispersed include silicone resins, modified silicone resins, epoxy resins, modified epoxy resins, urea resins, phenolic resins, acrylic resins, urethane resins, fluoric resins, or a resin containing two or more of these resins. For the phosphor, a known material can be used. Examples of the phosphor include YAG-based phosphors, fluoride-based phosphors such as KSF-based phosphors, nitride-based phosphors such as CASN, and β-SiAlON phosphors. The YAG-based phosphors are examples of a wavelength converting substance adapted to convert blue light into yellow light, the KSF-based phosphors and CASN are examples of a wavelength converting substance adapted to convert blue light into red light, and the β-SiAlON phosphors are examples of a wavelength converting substance adapted to convert blue light into green light. A quantum dot phosphor may be used for the phosphor.

Substrate 200E

The light-emitting device 100E further includes a substrate 200E at a side opposite to the upper surface, at which the upper surface 120Ea of the light-transmitting member 120E is located, of the light-emitting device 100E. The substrate 200E includes a main body portion 210E, a first conductive part 201E and a second conductive part 202E.

The main body portion 210E of the substrate 200E is a support body which is generally made of an insulative material such as ceramic or resin, and has a thickness of, for example, about 140 μm. The main body portion 210E may be a member made of a composite material such as glass epoxy. For the main body portion 210E, a metal substrate with an insulating layer over a surface of the metal substrate can be used.

As schematically shown in FIG. 11, a portion of the first conductive part 201E is located on an upper surface 210Ea of the main body portion 210E and is electrically connected with the first electrode 111 of the light-emitting element 110 via a bonding material not shown in figures. The first conductive part 201E further includes a part located on the lower surface 210Eb of the main body portion 210E and a part located on the inner surface of a through hole 220 formed in the body portion 210E. The part of the first conductive part 201E located on the lower surface 210Eb of the main body portion 210E is electrically connected with the first electrode 111 of the light-emitting element 110 via the part of the first conductive part 201E located on the inner surface defining the through hole 220. Similarly, the second conductive part 202E includes a part electrically connected with the second electrode 112 of the light-emitting element 110 at the upper surface 210Ea and a part located on the lower surface 210Eb of the main body portion 210E and electrically connected with the second electrode 112 via a part of the second conductive part 202E located on the inner surface defining the through hole 220. The through hole 220 can be filled with a resin or the like.

The part of the first conductive part 201E located on the lower surface 210Eb of the main body portion 210E and a part of the second conductive part 202E located on the lower surface 210Eb function as terminals for physically and electrically connecting the light-emitting device 100E to the wiring board or relevant components. Examples of the materials of the first conductive part 201E and the second conductive part 202E include Au, Pt, Pd, Rh, Ni, W, Mo, Cr, Ti, Fe, Cu, Al, Ag, and alloys containing one or more of these elements. The first conductive part 201E and the second conductive part 202E may be in the form of a single layer film or may be in the form of a multilayer film.

In the configuration illustrated in FIG. 10 and FIG. 11, the structure on the substrate 200E is substantially the same as that of the light-emitting device 100A which has been described with reference to FIG. 2, FIG. 3 and FIG. 4 except that the outer shape of the structure is longer in the Y-direction than in the X-direction, the reflecting member 130E reaches the upper surface 210Ea of the body portion 210E of the substrate 200E, and the structure includes the wavelength conversion member 150E. For the structure on the substrate 200E, a structure as in the light-emitting device 100D, which includes the reflecting member 130D defining the recesses 130r such as shown in FIG. 8, can be employed.

The effect of widening light distribution due to exposing the lateral surfaces 123c of the light-transmitting member 120E out of the reflecting member 130E was evaluated in the manner as below.

Figure 12:
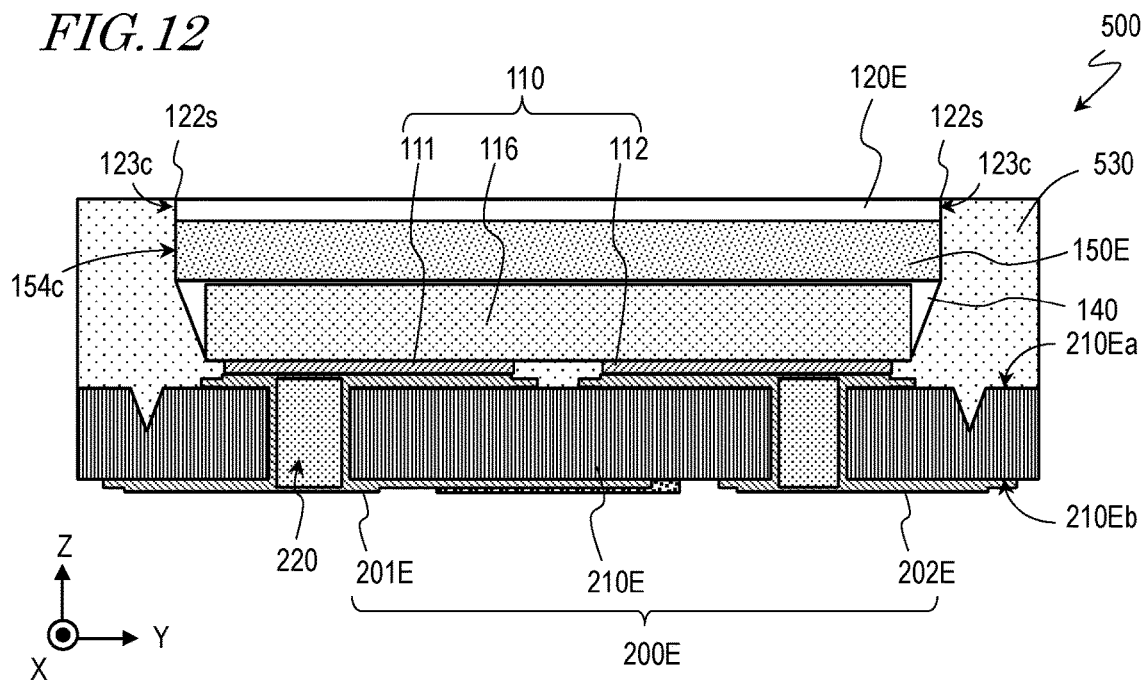
FIG. 12 is a schematic YZ cross-sectional view of a light-emitting device as the second sample in which the entirety of the four lateral surfaces of the light-transmitting member is covered with a reflecting member.

A light-emitting device having an oblong rectangular shape in a top view, as in the light-emitting device 100E described above, and in which lateral surfaces 123c on the transverse sides of the light-transmitting member are entirely exposed out of the reflecting member was formed as a first sample. In the first sample, the external appearance of the reflecting member and the light-transmitting member is the same as that of the example shown in FIG. 10. A light-emitting device in which an entirety of four lateral surfaces of the light-transmitting member are covered with the reflecting member was formed as a second sample. In FIG. 12, a YZ cross section of a light-emitting device 500, which is the second sample, is schematically shown. The reflecting member 530 of the light-emitting device 500 covers four lateral surfaces, including the two lateral surfaces 123c, of the light-transmitting member 120E. A portion of the reflecting member 530 covering the lateral surfaces 123c had a thickness of approximately 50 µm. Another portion of the reflecting member 530 covering the lateral surfaces 122c each perpendicular to a respective one of the lateral surfaces 123c had a thickness of about 35 µm. In the first sample, the portion of the reflecting member covering the lateral surfaces 122c each perpendicular to a respective one of the lateral surfaces 123c has a thickness generally equal to that of the reflecting member 530.

Figure 13:
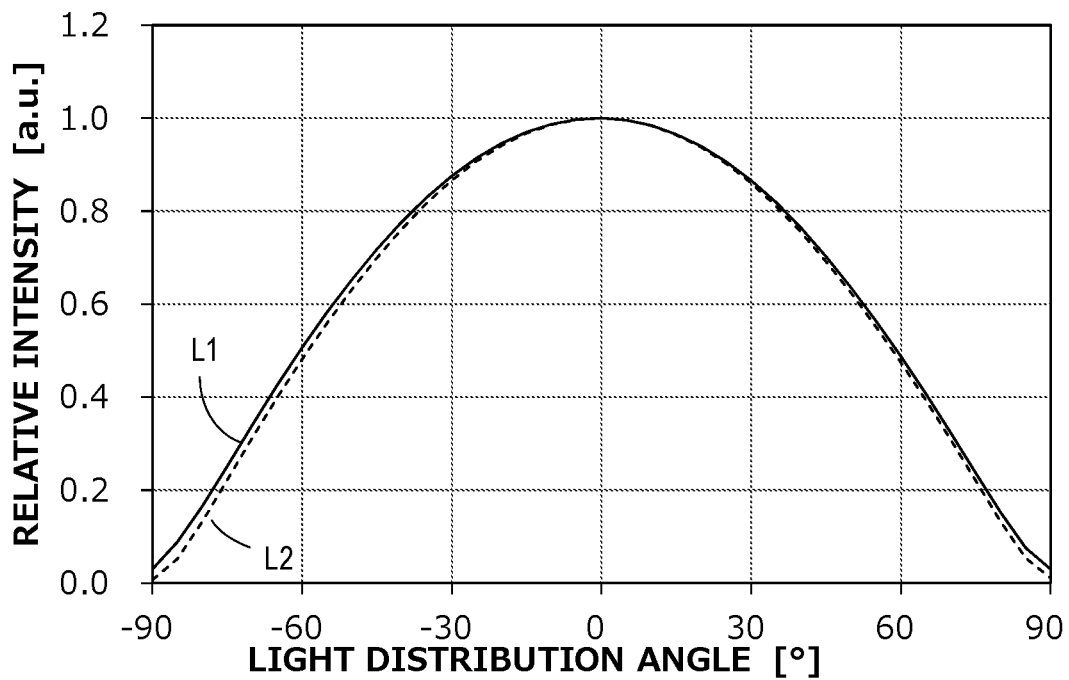
FIG. 13 is a graph showing the measurement results of the light distribution characteristics in a longitudinal direction of the first and second samples.

FIG. 13 shows the measurement results of the light distribution characteristic in a longitudinal direction of each of the first and second samples. In FIG. 13, solid line L1 represents the measurement result of the first sample, and broken line L2 represents the measurement result of the second sample. In the example of FIG. 13, the full width at half maximum (FWHM) for the first sample was 120°, which was greater than the full width at half maximum of 117° for the second sample. Thus, with the lateral surfaces 123c of the light-transmitting member exposed out of the reflecting member, effect of widening light distribution can be obtained.

Figure 14:
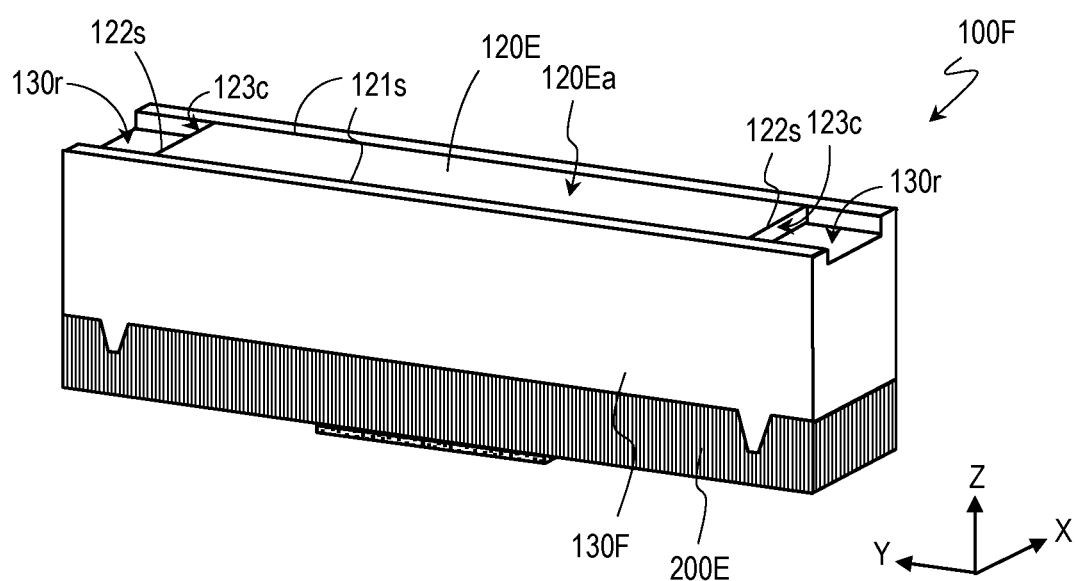
FIG. 14 is a schematic perspective view showing an example of a light-emitting device which has an oblong rectangular shape in the top view and in which the reflecting member defines recesses.

FIG. 14 shows an example of a light-emitting device which has an oblong rectangular shape in a top view and in which the reflecting member defines recesses. The light-emitting device 100F shown in FIG. 14 includes a reflecting member 130F instead of the reflecting member 130E of the light-emitting device 100E that has been described with reference to FIG. 10 and FIG. 11. The reflecting member 130F defines recesses 130r at opposite ends in the Y-direction of the light-transmitting member 120E as in the reflecting member 130D of the light-emitting device 100D that has been described with reference to FIG. 8. Each of the two lateral surfaces 123c of the light-transmitting member 120E is partially or entirely exposed out of the reflecting member 130F at the recesses 130r.

Figure 15:
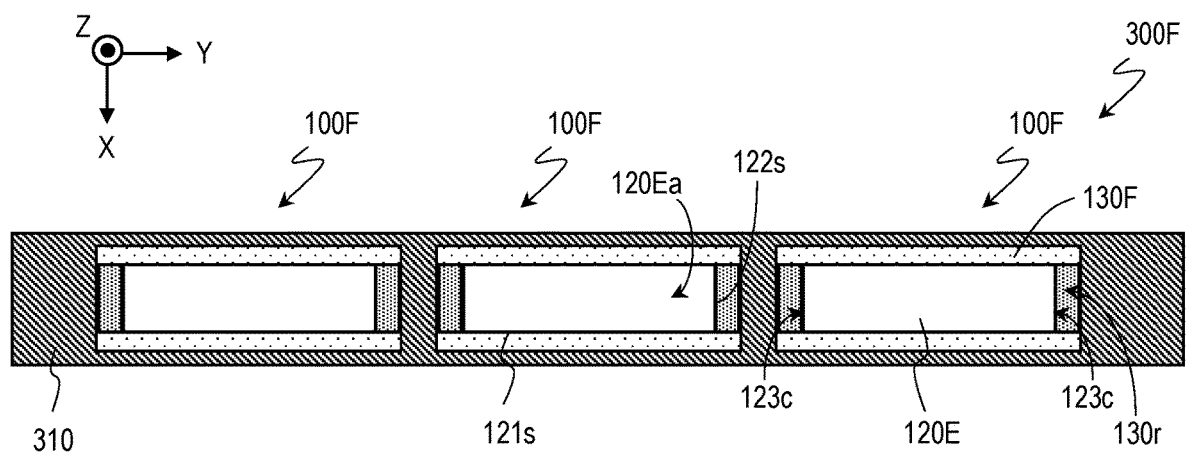
FIG. 15 is a schematic plan view showing still another example of a light source unit which includes a plurality of light-emitting devices.

FIG. 15 shows still another example of a light source device which includes a plurality of light-emitting devices. The light source device 300F shown in FIG. 15 includes a wiring board 310 and three light-emitting devices 100F. The three light-emitting devices 100F are arranged on the wiring board 310 along the extending direction of the first sides 121s of the upper surface 120Ea.

In the example shown in FIG. 15, light is emitted from the light-emitting devices 100F in the normal direction of the wiring board 310 (i.e., a front direction in the drawing). With a plurality of light-emitting devices 100F arranged along the extending direction of the first sides 121s, a light distribution in the Y-direction, along which the light-emitting devices 100F are arranged, can be widen, while spread of light is reduced in the X-direction, as in the example that has been described with reference to FIG. 5 and FIG. 9. Also when the above-described light-emitting devices 100E are arranged instead of the light-emitting devices 100F, light distribution similar to that when the light-emitting devices 100F are arranged can be obtained.

Figure 16:
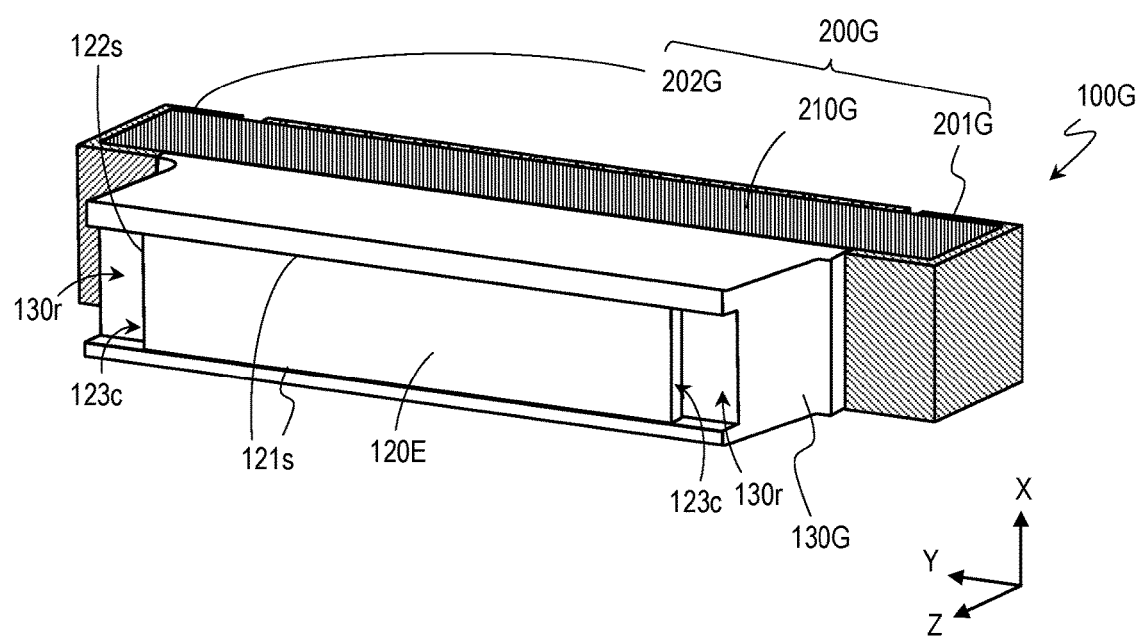
FIG. 16 is a schematic perspective view showing another example of a light-emitting device which includes a substrate.
Figure 17:
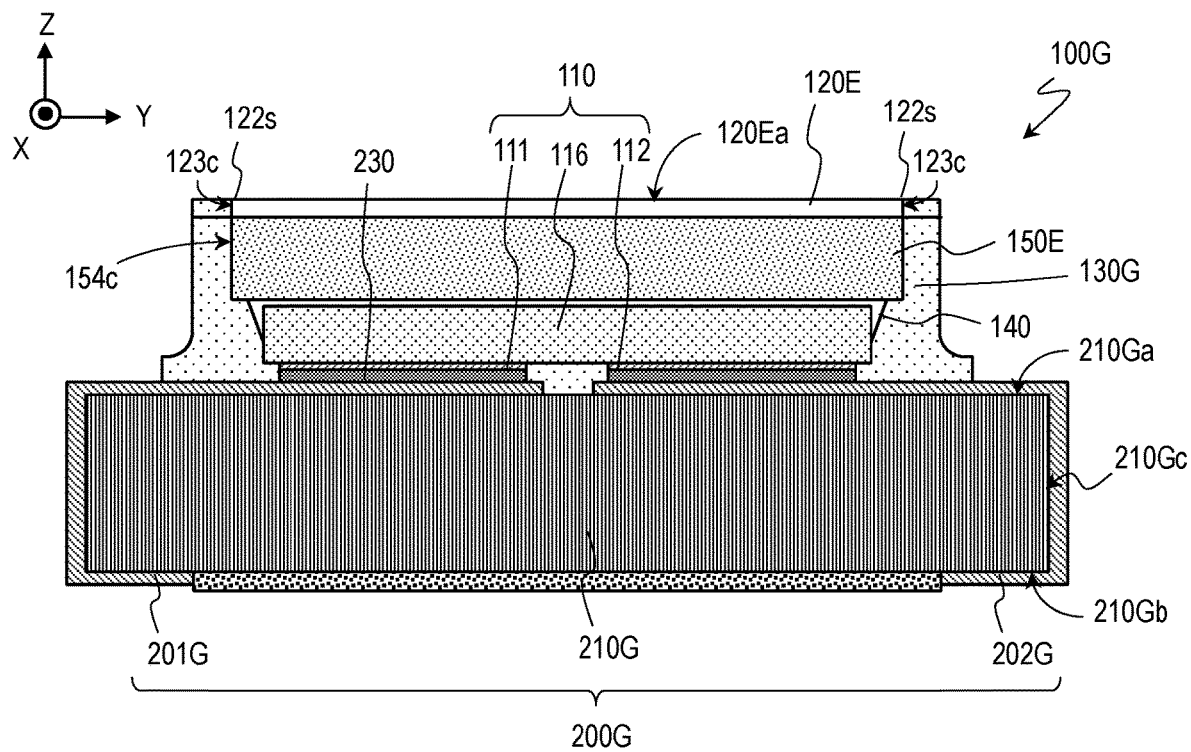
FIG. 17 is a schematic cross-sectional view of the light-emitting device 100G shown in FIG. 16 taken along a plane parallel to the YZ plane at a position near the center of the light-emitting device 100G.
Figure 18:
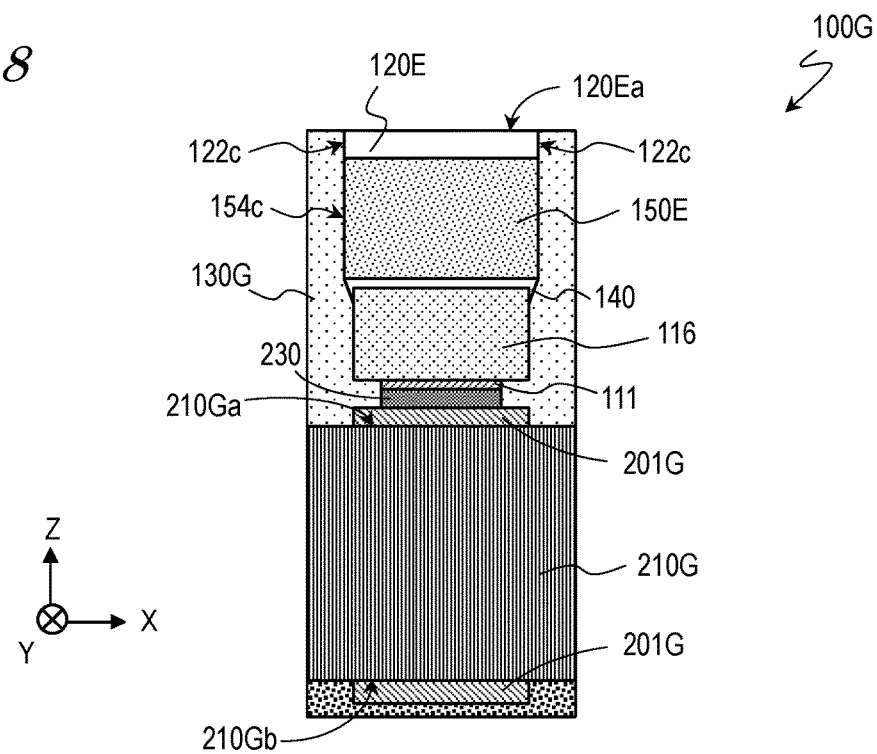
FIG. 18 is a schematic cross-sectional view of the light-emitting device 100G shown in FIG. 16 taken along a plane parallel to the ZX plane at a position near the center of the light-emitting device 100G.

FIG. 16 shows another example of a light-emitting device which includes a substrate. FIG. 17 schematically shows a cross section of the light-emitting device 100G shown in FIG. 16 taken along a plane parallel to the YZ plane at a position near the center of the light-emitting device 100G. FIG. 18 schematically shows a cross section of the light-emitting device 100G taken along a plane parallel to the ZX plane at a position near the center of the light-emitting device 100G. In FIG. 17, for ease of understanding, the cross-sectional surface of the reflecting member 130G is provided with a hatching, and also a portion of the reflecting member 130G that is seen behind the cross-sectional surface are given with the same hatching as that of the cross-sectional surface of the reflecting member 130G.

The light-emitting device 100G illustrated in FIG. 16, FIG. 17 and FIG. 18 includes a substrate 200G instead of the substrate 200E. The substrate 200G includes a main body portion 210G, a first conductive part 201G and a second conductive part 202G that are disposed on the body portion 210G. In comparison with the light-emitting device 100F shown in FIG. 14, the light-emitting device 100G includes a reflecting member 130G instead of the reflecting member 130F. The reflecting member 130G defines recesses 130r at an upper surface of the reflecting member 130G, and the above-described reflecting member 130F also has this feature. The reflecting member 130G covers an entirety of each of the two lateral surfaces 122c of the light-transmitting member 120E and covers an entirety of each of the four lateral surfaces 154c of the wavelength conversion member 150E as in the above-described reflecting member 130E and reflecting member 130F.

Description below will be given with reference to FIG. 17. The first conductive part 201G is electrically connected with the first electrode 111 of the light-emitting element 110 via a bonding member 230. Similarly, the second conductive part 202G is electrically connected with the second electrode 112 of the light-emitting element 110 via another bonding member 230. For the bonding member 230, for example, a solder can be used. Examples of a material of the bonding member 230 include Au-containing alloys, Ag-containing alloys, Pd-containing alloys, In-containing alloys, Pb—Pd containing alloys, Au—Ga containing alloys, Au—Sn containing alloys, Sn-containing alloys, Sn—Cu containing alloys, Sn—Cu—Ag containing alloys, Au—Ge containing alloys, Au—Si containing alloys, Al-containing alloys, Cu—In containing alloys, and mixtures of metals and a flux. For the material of the bonding member 230, a material in the form of liquid, paste, or solid (sheet, block, powder, wire) can be appropriately used. The bonding member 230 may be made of a single member or may be a combination of a plurality of types of members.

As schematically shown in FIG. 17, each of the first conductive part 201G and the second conductive part 202G also includes a portion which is present on the lateral surface 210Gc of the body portion 210G. Therefore, the substrate 200G is configured to supply electricity from the lower surface 210Gb side of the body portion 210G to the first electrode 111 and the second electrode 112 of the light-emitting element 110. Also in this example, the body portion 210G has a generally rectangular parallelepiped shape. The dimensions of the body portion 210G include, for example, the length (Y-direction) of 1800 μm, the width (X-direction) of 300 μm, and the height (Z-direction) of 360 μm.

Figure 19:
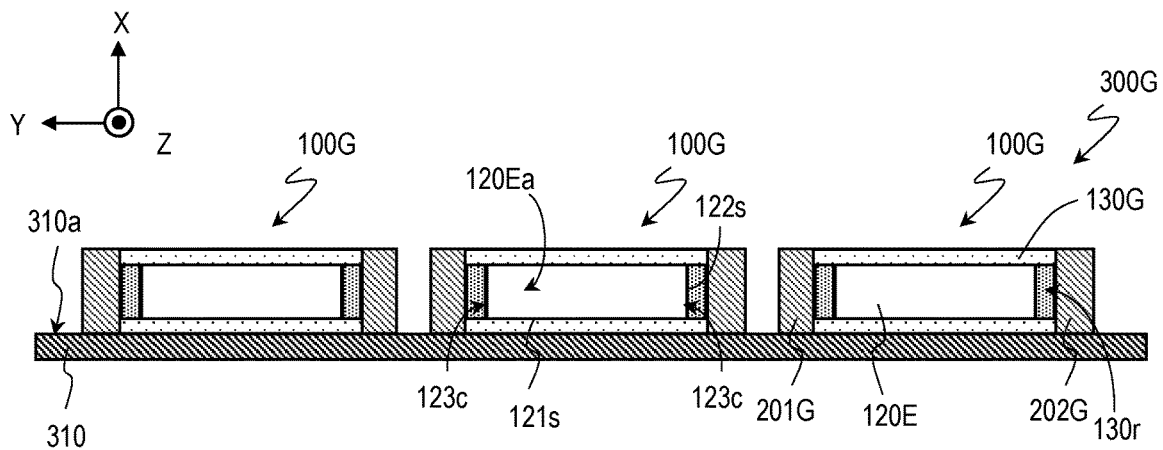
FIG. 19 is a schematic front view showing still another example of a light source device which includes a plurality of light-emitting devices.

FIG. 19 shows still another example of a light source device which includes a plurality of light-emitting devices. The light source device 300G shown in FIG. 19 includes a wiring board 310 and three light-emitting devices 100G arranged on the wiring board 310.

In this example, each light source device 300G is mounted onto a principal surface 310a of the wiring board 310 such that the normal of the upper surface 120Ea of the light-transmitting member 120E is perpendicular to the normal of the principal surface 310a of the wiring board 310. That is, in this example, light is emitted from each light source unit 300G in the Z-direction of the drawings. The light-emitting device 100G is an example of a so-called side view type light-emitting device.

Figure 20:
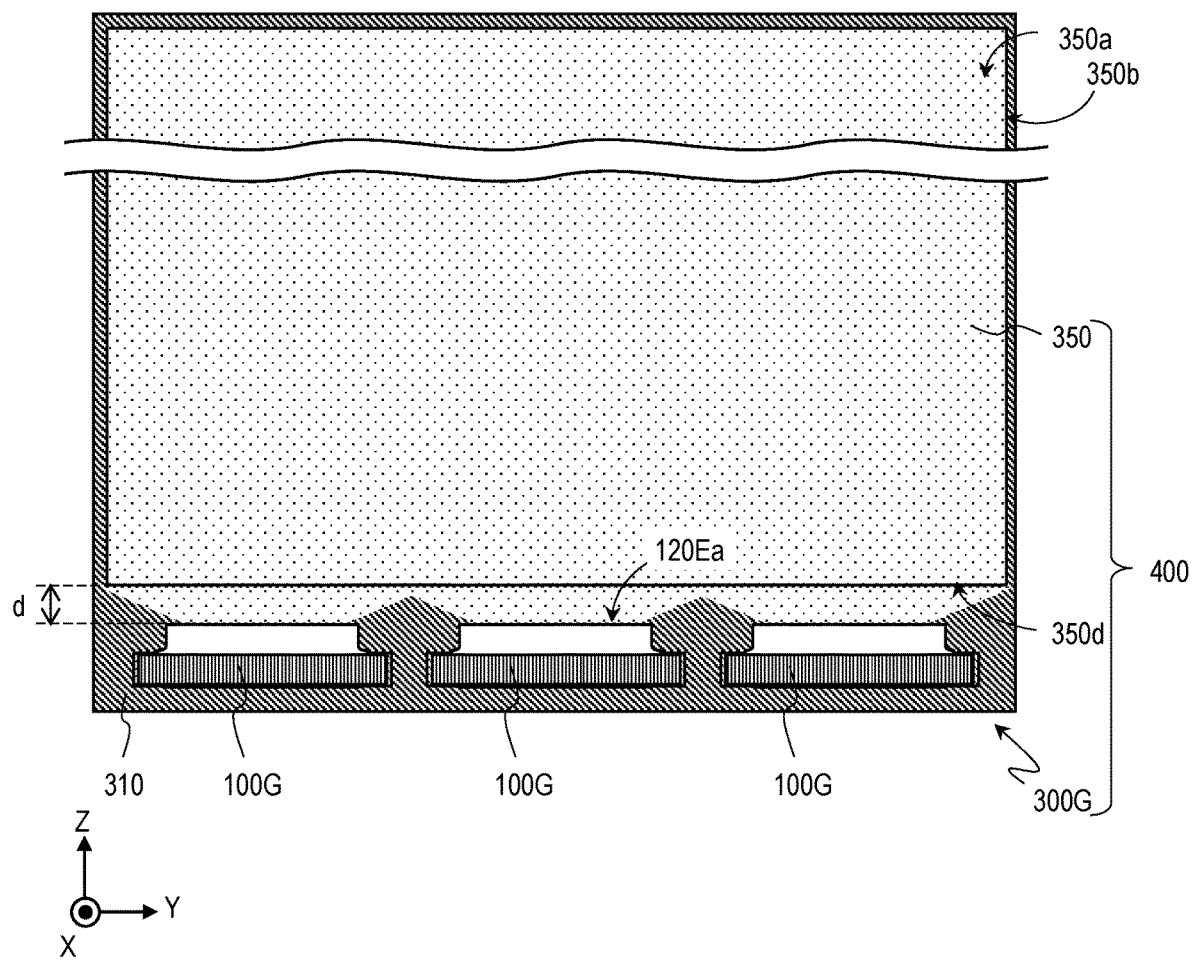
FIG. 20 is a schematic plan view showing an example of a backlight in which light-emitting devices are combined with a light guide.

FIG. 20 shows an example of a backlight device in which light-emitting devices are combined with a light guide plate. The backlight 400 shown in FIG. 20 includes a light source device 300G which includes a plurality of light-emitting devices 100G and a light guide plate 350 which has a light incident surface 350d. The light guide 350 has an upper surface 350a and a lower surface 350b which are the two principal surfaces.

The light incident surface 350d is located between the upper surface 350a and the lower surface 350b.

In this example, the three light-emitting devices 100G are arranged on the wiring board 310 along the extending direction of the first sides 121s, in other words, along the longitudinal direction of the light-emitting devices 100G. In this example, the light guide plate 350 is also disposed on the wiring board 310.

The light incident surface 350d of the light guide 350 faces the upper surface 120Ea of the light-transmitting member 120E of each of the light-emitting devices 100G such that the light incident surface 350d is optically coupled with the light-emitting device 100G.

As schematically shown in FIG. 20, light emitted from each of the light-emitting devices 100G incident on the light guide plate 350 from the light incident surface 350d. The light incident on the light incident surface 350d is emitted from the upper surface 350a of the light guide 350. The backlight device 400 can be used for, for example, a liquid crystal display device. In this case, the light-emitting devices 100G are disposed at a peripheral portion of the liquid crystal panel and supply light from the peripheral portion of the liquid crystal panel to the rear surface of the liquid crystal panel via the light guide plate 350.

According to the present embodiment, in the longitudinal direction of the light-emitting device, white light can be emitted to a region at a greater angle with respect to the normal direction of the upper surface of the light-transmitting member. Therefore, at a position closer to the upper surface of the light-transmitting member, uniform white light with reduced unevenness in emission color can be obtained. Thus, the distance d between the upper surface of the light-transmitting member and the light incident surface 350d of the light guide 350 can be reduced. Reduction of the distance d allows reduction in size of a display device such as a liquid crystal display device, particularly narrowing of a frame called "bezel" of a display device. The distance d between the upper surface 120Ea, which is a light emission surface of the light-emitting device 100G, and the light entry surface 350d can be, for example, in the range of 0 μm to 300 μm. According to certain embodiments of the present disclosure, the distance d can be reduced to the range of 0 μm to 5 μm.

For the light-emitting device to be combined with the light guide 350, any of the light-emitting devices according to certain embodiments of the present disclosure can be employed. Any appropriate number of light-emitting devices may be optically coupled with the light guide 350.

Figure 21:
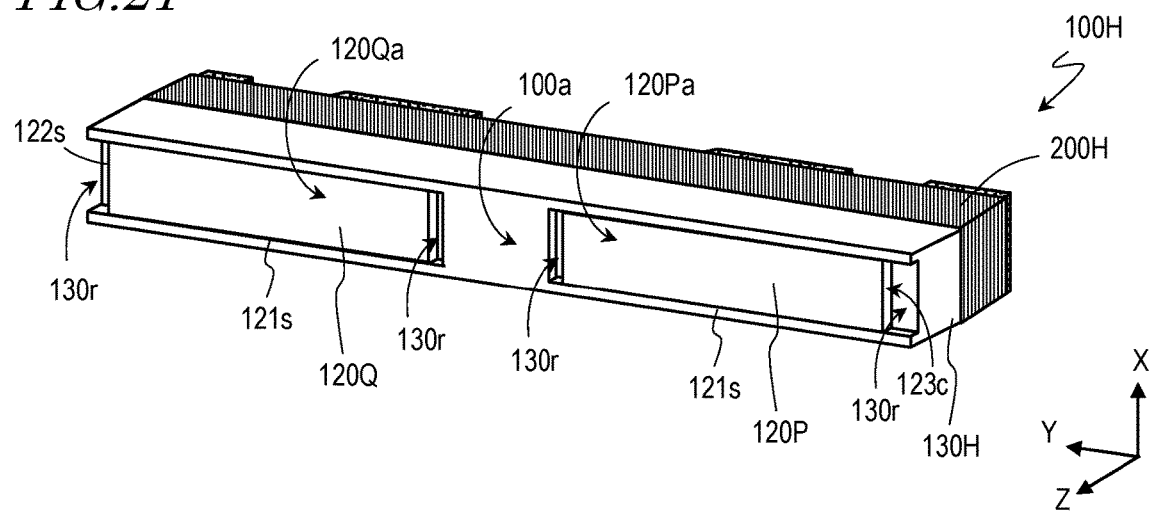
FIG. 21 is a schematic perspective view of still another variant example of the light-emitting device of the first embodiment of the present disclosure when viewed from the front side.
Figure 22:
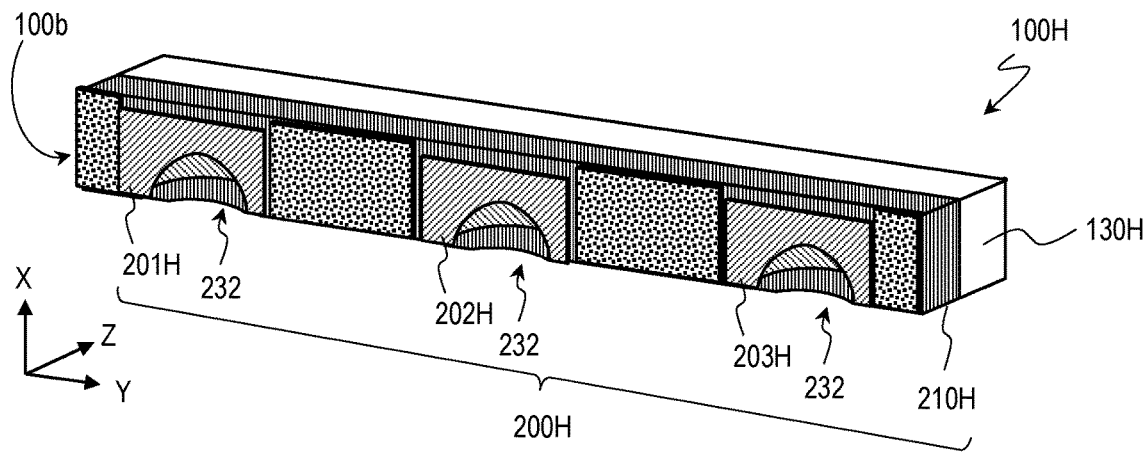
FIG. 22 is a schematic perspective view of the light-emitting device shown in FIG. 21 when viewed from the rear side.
Figure 23:
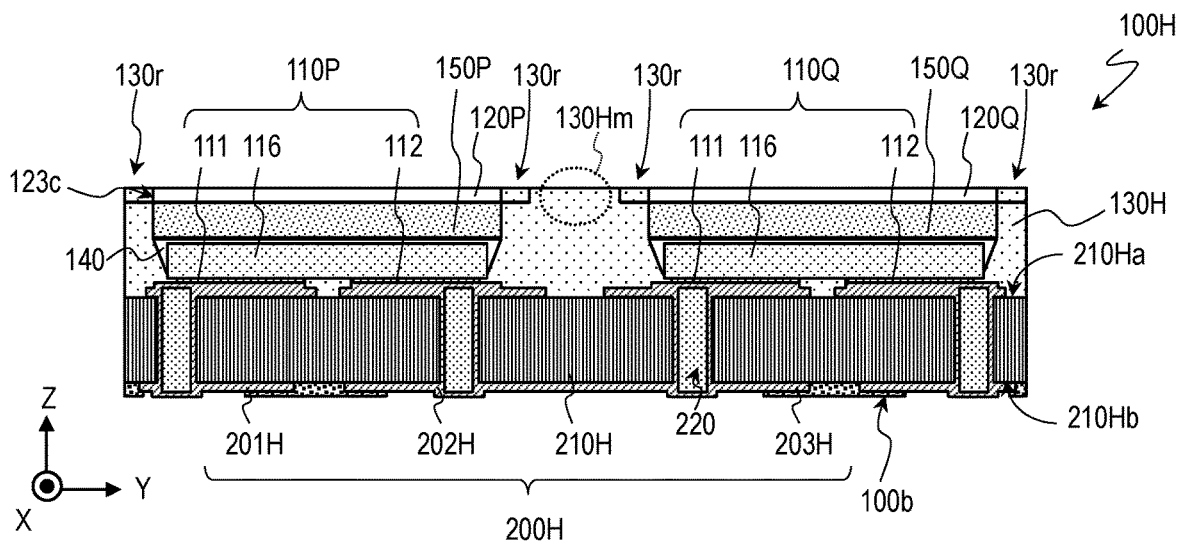
FIG. 23 is a schematic cross-sectional view of the light-emitting device 100H shown in FIG. 21 taken along a plane parallel to the YZ plane at a position near the center of the light-emitting device 100H.

FIG. 21, FIG. 22 and FIG. 23 show still another variant example of the light-emitting device of the first embodiment of the present disclosure. FIG. 22 is a schematic perspective view of the light-emitting device 100H shown in FIG. 21 when viewed from the rear side of the light-emitting device 100H. FIG. 23 is a schematic cross-sectional view of the light-emitting device 100H shown in FIG. 21 taken along a plane parallel to the YZ plane at a position near the center of the light-emitting device 100H.

The light-emitting device 100H shown in FIG. 21 includes a reflecting member 130H, a substrate 200H, and a light-transmitting member 120P (i.e., first light-transmitting member 120P) and a light-transmitting member 120Q (i.e., second light-transmitting member 120P) which are located at an upper surface 100a side of the light-emitting device 100H. That is, the light-emitting device 100H includes two light-transmitting members which are spaced apart from each other.

In the configuration illustrated in FIG. 21, the reflecting member 130H defines four recesses 130r at the upper surface 100a side of the light-emitting device 100H. These four recesses 130r are arranged along the extending direction of the first sides 121s of the upper surface 120Pa of the light-transmitting member 120P and the first sides 121s of the upper surface 120Qa of the light-transmitting member 120Q. As shown in the drawings, each of the two lateral surfaces 123c of the light-transmitting member 120P and each of the two lateral surfaces 123c of the light-transmitting member 120Q are exposed out of the reflecting member 130H at the respective recesses 130r. Therefore, in this example, light is emitted from the upper surface 120Pa and the two lateral surfaces 123c of the light-transmitting member 120P and from the upper surface 120Qa and the two lateral surfaces 123c of the light-transmitting member 120Q. In FIG. 23, as in FIG. 17, for ease of understanding, a cross-sectional surface of the reflecting member 130H is provided with a hatching, and also portions of the reflecting member 130H which are seen behind the cross-sectional surface (more specifically, portions seen behind the recessed portions 130r) are provided with the same hatching as that of the cross-sectional surface of the reflecting member 130H.

Description below will be given with reference to FIG. 22 and FIG. 23. The substrate 200H includes a main body portion 210H and three conductive parts. As shown in FIG. 22, these three conductive parts include a first conductive part 201H, a second conductive part 202H and a third conductive part 203H. A portion of the first conductive part 201H, a portion of the second conductive part 202H and a portion of the third conductive part 203H is located on the lower surface 100b side of the light-emitting device 100H. The main body portion 210H defines recesses 232, at the lower surface 100b side of the light-emitting device 100H, at the positions corresponding to the first conductive part 201H, the second conductive part 202H and the third conductive part 203H. As will be described below, these three recessed portions 232 are utilized for electrical connection between the wiring board or the like and the respective conductive parts.

As shown in FIG. 23, the light-emitting device 100H includes a light-emitting element 110P (i.e., first light-emitting element) and a light-emitting element 110Q (i.e., second light-emitting element). The first electrode 111 of the light-emitting element 110P is connected with a portion of the first conductive part 201H located on the upper surface 210Ha of the body portion 210H by a bonding member that is not shown in figures.
The second electrode 112 of the light-emitting element 110P is connected with a portion of the second conductive part 202H which located on the upper surface 210Ha of the body portion 210H by a bonding member not shown in figures. In this example, the first electrode 111 and the second electrode 112 of the light-emitting element 110Q are electrically connected with a portion of the second conductive part 202H located on the upper surface 210Ha of the main body portion 210H and a portion of the third conductive part 203H located on the upper surface 210Ha of the body portion 210H, respectively. As in the example that has been described with reference to FIG. 11, a portion of the first conductive part 201H located on the upper surface 210Ha of the body portion 210H is electrically connected with a portion located on the lower surface 210Hb of the body portion 210H via a respective one of the through holes 220. This configuration is similar to that in the second conductive part 202H and that in the third conductive part 203H. Therefore, the light-emitting device 100H has a structure in which electricity can be supplied from the lower surface 100b side to the light-emitting element 110P and the light-emitting element 110Q. In the example shown in FIG. 23, the light-emitting element 110P and the light-emitting element 110Q are electrically connected in series. The first electrode 111 and the second electrode 112 of the light-emitting element 110Q may be connected with the second conductive part 202H and the third conductive part 203H, respectively, such that the light-emitting element 110P and the light-emitting element 110Q are electrically connected in parallel.

As schematically shown in FIG. 23, the light-emitting element 110P and the light-emitting element 110Q are supported by the substrate 200H, and accordingly, a wavelength conversion member 150P and the light-transmitting member 120P are disposed above the light-emitting element 110P, and a wavelength conversion member 150Q and the light-transmitting member 120Q are disposed above the light-emitting element 110Q. The light-emitting device 100H may include any appropriate number of light-emitting elements 110. The light-emitting device according to certain embodiments of the present disclosure may include three or more light-emitting elements 110. When the light-emitting device 100H includes two or more light-emitting elements 110, light emitted from these light-emitting elements 110 do not need to have an equal peak wavelength, and the wavelength conversion members 150P and 150Q may contain different phosphors.

The reflecting member 130H includes a portion 130Hm located between the light-transmitting member 120P and the light-transmitting member 120Q. Two recesses 130r near the center of the light-emitting device 100H are not in communication with each other. In other words, the portion 130Hm of the reflecting member 130H is located between one of the two lateral surfaces 123c of the light-transmitting member 120P located closer to the center of the light-emitting device 100H than the other of the two lateral surfaces 123c of the light-transmitting member 120P and one of the two lateral surfaces 123c of the light-transmitting member 120Q located closer to the center of the light-emitting device 100H than the other of the two lateral surfaces 123c of the light-transmitting member 120Q, and the lateral surface 123c of the light-transmitting member 120P located closer to the center of the light-emitting device 100H and the lateral surface 123c of the light-transmitting member 120Q closer to the center of the light-emitting device 100H do not face each other.

Figure 24:
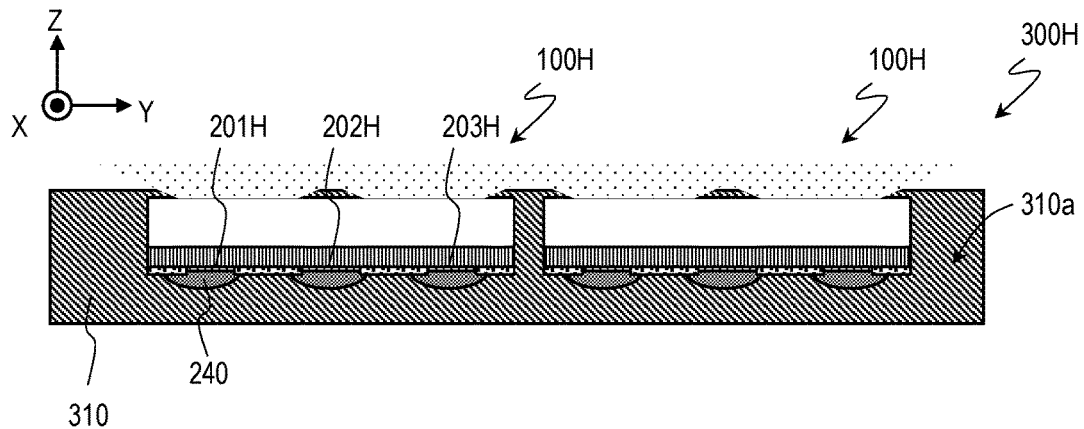
FIG. 24 is a schematic plan view showing an example of a light source device which includes the light-emitting device shown in FIG. 21, FIG. 22 and FIG. 23.

FIG. 24 shows an example of a light source device which includes the light-emitting device shown in FIG. 21, FIG. 22 and FIG. 23. The light source device 300H shown in FIG. 24 includes a plurality of light-emitting devices 100H disposed on the wiring board 310. Herein, to avoid complicated drawing, only two of the plurality of light-emitting devices 100H arranged along the first sides 121s are shown in FIG. 24.

The light-emitting device 100H is mounted onto the principal surface 310a such that the normal of the upper surface of the light-transmitting members 120P and 120Q is perpendicular to the normal of the principal surface 310a of the wiring board 310, as in the light-emitting device 100G of the light source unit 300G shown in FIG. 19. As schematically shown in FIG. 24, each of the light-emitting devices 100H is mounted on the wiring board 310 via a respective one of solders 240 disposed in each of the recesses 232 (see FIG. 22) each corresponding to a respective one of the first conductive part 201H, the second conductive part 202H and the third conductive part 203H. With the recesses 232 defined at the lower surface 100b side of the light-emitting device and the solders 240 disposed on the wiring board 310 at positions corresponding to the recesses 232, the wiring board 310 is electrically and physically connected with the respective conductive parts via the solders 240, so that the light-emitting devices 100H can be more surely secured to the wiring board 310.

Figure 25:
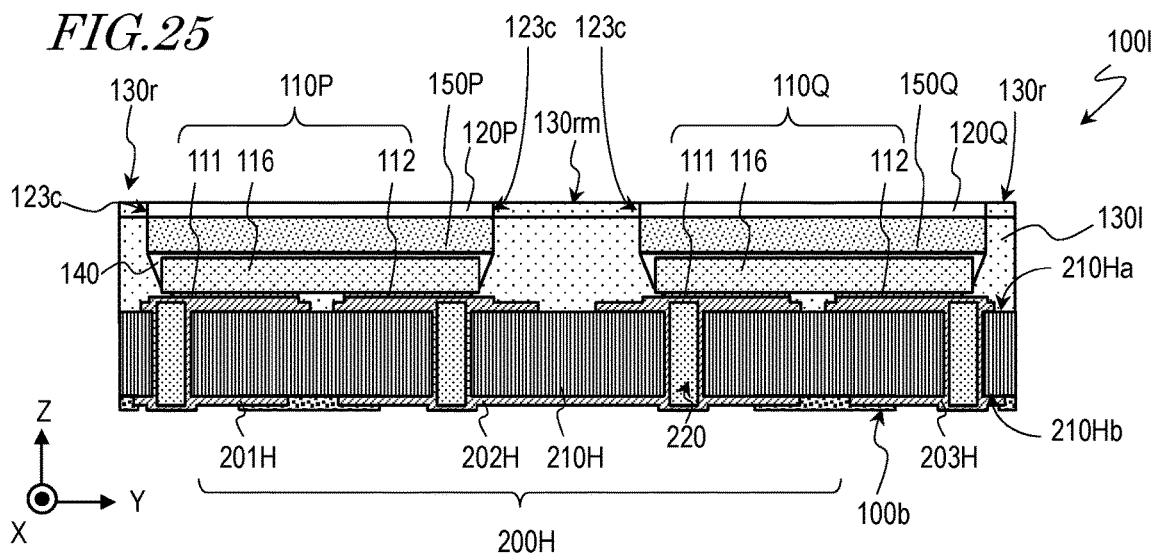
FIG. 25 is a schematic cross-sectional view showing another example of a light-emitting device which includes a plurality of light-emitting elements.

FIG. 25 shows another example of a light-emitting device which includes a plurality of light-emitting elements. FIG. 25 is a schematic cross-sectional view which corresponds to the YZ cross-sectional view shown in FIG. 23. The light-emitting device 100I shown in FIG. 25 includes a light-emitting element 110P and a light-emitting element 110Q as in the example described above with reference to FIG. 23. The light-transmitting member 120P and the light-transmitting member 120Q are disposed above the light-emitting element 110P and the light-emitting element 110Q, respectively.

In comparison with the light-emitting device 100H shown in FIG. 23, the light-emitting device 100I includes a reflecting member 130I instead of the reflecting member 130H. As schematically shown in FIG. 25, a single recess 130rm is defined near the center of the reflecting member 130I. The lateral surface 123c of the light-transmitting member 120P and the lateral surface 123c of the light-transmitting member 120Q face each other across the recess 130rm. In other words, the reflecting member 130I does not include a portion located between one of the two lateral surfaces 123c of the light-transmitting member 120P at a position near the center of the light-emitting device 100I and one of the two lateral surfaces 123c of the light-transmitting member 120Q at a position near the center of the light-emitting device 100I. In FIG. 25, as in FIG. 23, for ease of understanding, a cross-sectional surface of the reflecting member 130I is provided with a hatching, and also portions of the reflecting member 130I which are seen behind the cross-sectional surface (more specifically, portions seen behind the recesses 130r and the recess 130rm) are provided with the same hatching as that of the cross-sectional surface of the reflecting member 130I.

Figure 26:
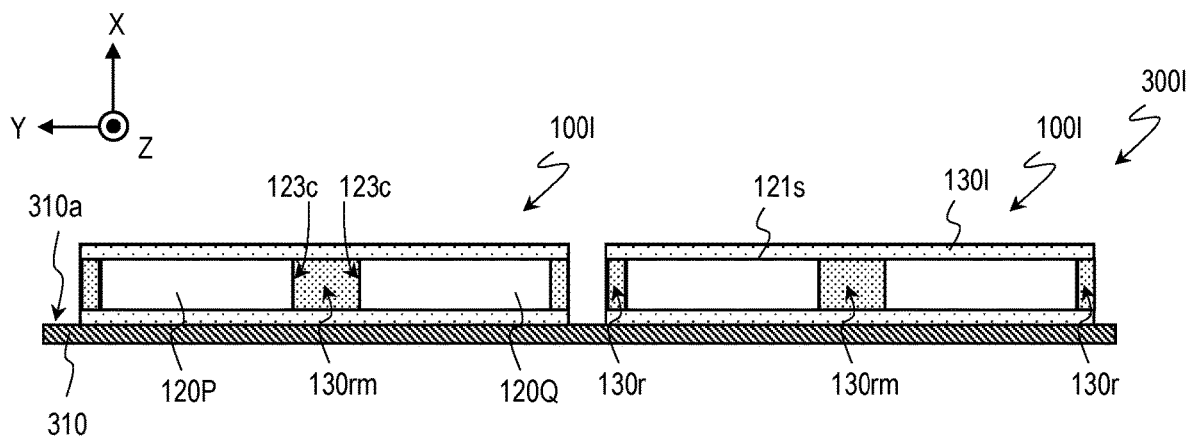
FIG. 26 is a schematic front view showing a light source device which includes a plurality of light-emitting devices shown in FIG. 25.

FIG. 26 shows a light source unit which includes a plurality of light-emitting devices shown in FIG. 25. The light source device 300I shown in FIG. 26 includes a wiring board 310 and two light-emitting devices 100I disposed on the wiring board 310. As shown in FIG. 26, in the top view, the reflecting member 130I may not include a portion located between the light-transmitting member 120P and the light-transmitting member 120Q that are spaced apart from each other along the extending direction of the first sides 121s.

Second Embodiment

Figure 27:
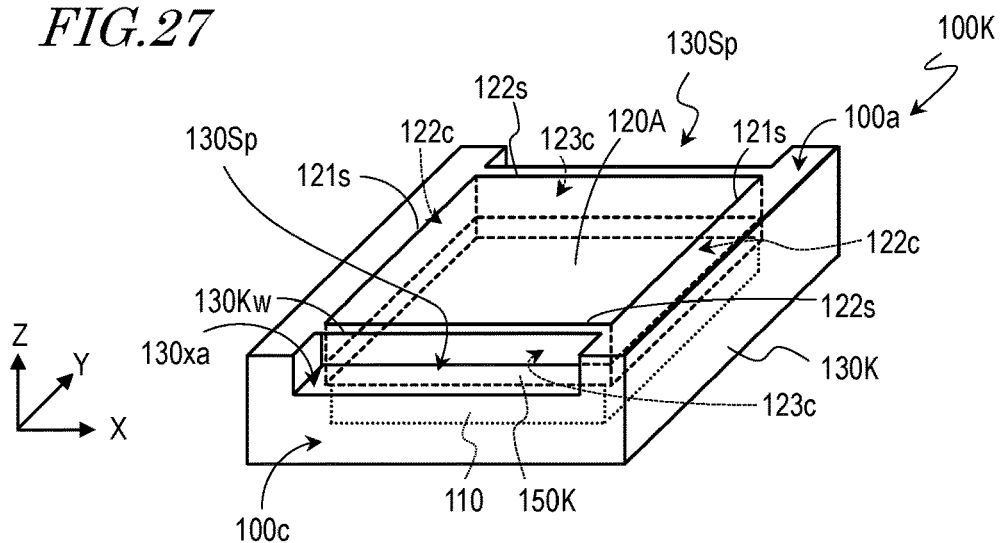
FIG. 27 is a schematic perspective view showing a light-emitting device of the second embodiment of the present disclosure.
Figure 28:
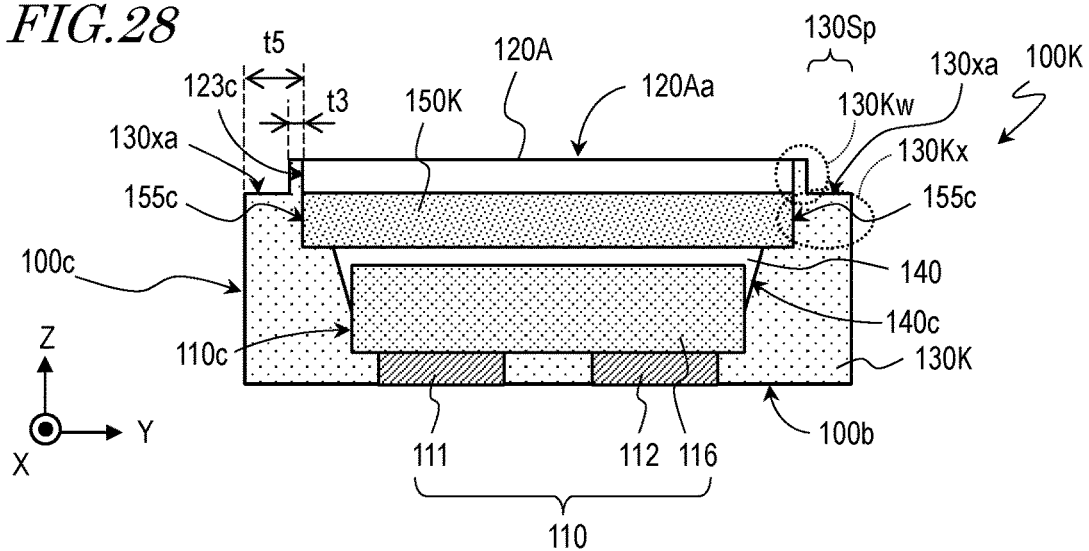
FIG. 28 is a schematic cross-sectional view of the light-emitting device 100K shown in FIG. 27 taken along a plane parallel to the YZ plane at a position near the center of the light-emitting device 100K.
Figure 29:
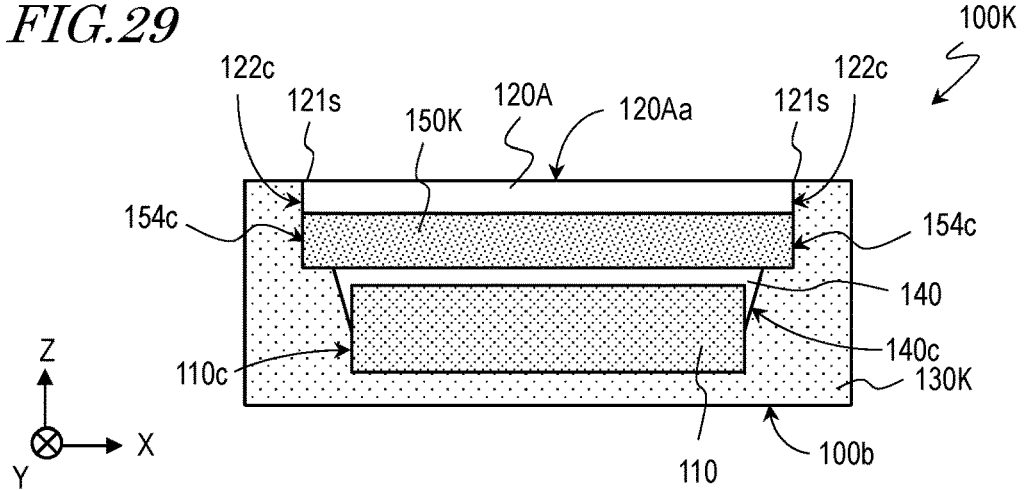
FIG. 29 is a schematic cross-sectional view of the light-emitting device 100K shown in FIG. 27 taken along a plane parallel to the ZX plane at a position near the center of the light-emitting device 100K.

FIG. 27, FIG. 28 and FIG. 29 show a light-emitting device according to the second embodiment of the present disclosure. FIG. 28 schematically shows a cross section of the light-emitting device 100K shown in FIG. 27 taken along a plane parallel to the YZ plane at a position near the center of the light-emitting device 100K. FIG. 29 schematically shows a cross section of the light-emitting device 100K taken along a plane parallel to the ZX plane at a position near the center of the light-emitting device 100K.

The light-emitting device 100K shown in FIG. 27, FIG. 28 and FIG. 29 generally includes a light-emitting element 110, a wavelength conversion member 150K, a light-transmitting member 120A and a reflecting member 130K. As schematically shown in FIG. 27, the reflecting member 130K covers two lateral surfaces 122c of the light-transmitting member 120A. The reflecting member 130K includes wall portions 130Kw which cover the other two lateral surfaces 123c of the light-transmitting member 120A.

The wavelength conversion member 150K is present between the light-emitting element 110 and the light-transmitting member 120A (see FIG. 28 and FIG. 29) as is the wavelength conversion member 150E in the light-emitting device 100E described above. The light-transmitting member 120A has a substantially square shape in a top view, and accordingly, the wavelength conversion member 150K also has a substantially square shape in a top view, and the wavelength conversion member 150K has two lateral surfaces 154c (i.e., fourth lateral surfaces) which are opposite to each other and two lateral surfaces 155c (i.e., fifth lateral surfaces) which are opposite to each other. Each of the lateral surfaces 154c and each of the lateral surfaces 155c of the wavelength conversion member 150K are respectively parallel to a respective one of the lateral surfaces 122c and a respective one of the lateral surfaces 123c of the light-transmitting member 120A, respectively.

Generally, each of the lateral surfaces 154c of the wavelength conversion member 150K is in the same plane as a respective one of the lateral surfaces 122c of the light-transmitting member 120A, and each the lateral surfaces 155c of the wavelength conversion member 150K is in the same plane as a respective one of the lateral surfaces 123c of the light-transmitting member 120A. On the other hand, each of the lateral surfaces of the wavelength conversion member 150K may not be in the same plane as a respective one of the lateral surfaces of the light-transmitting member 120A. Also, the light-transmitting member 120A may not have a square shape in a top view. The upper surface of the light-transmitting member 120A may have an oblong rectangular shape. In this case, the lateral surfaces 123c are surfaces which include the shorter sides of the sides forming the oblong rectangular shape of the upper surface of the light-transmitting member, and the lateral surfaces 122c are surfaces which include the longer sides of the sides forming the oblong rectangular shape of the upper surface of the light-transmitting member.

As shown in FIG. 28 and FIG. 29, the reflecting member 130K covers the entirety of the outer surfaces 140c of the light guiding member 140 and the lateral surfaces 110c of the light-emitting element 110. The reflecting member 130K also covers the two lateral surfaces 154c and the other two lateral surfaces 155c of the wavelength conversion member 150K. That is, the reflecting member 130K covers the lateral surfaces 110c of the light-emitting element 110, the entirety of the lateral surfaces 122c and the entirety of the lateral surfaces 123c of the light-transmitting member 120A, and the entirety of the lateral surfaces 154c and the entirety of the lateral surfaces 155c of the wavelength conversion member 150K.

As shown in FIG. 28, the wall portions 130Kw (i.e., first portions) of the reflecting member 130K that cover the lateral surfaces 123c of the light-transmitting member 120A has a thickness smaller than a thickness t5 of portions 130Kx (i.e., second portions) of the reflecting member 130K that cover the lateral surfaces 155c of the wavelength conversion member. As in this example, when the reflecting member 130K includes a relatively thin portion, a portion of light incident on the reflecting member 130K can be transmitted through the relatively thin portion of the reflecting member 130K. In particular, in this example, portions of the reflecting member 130K covering the lateral surfaces 123c have a smaller thickness than a thickness of portions of the reflecting member 130K covering the lateral surfaces 122c of the light-transmitting member 120A. Therefore, while light incident on the portions of the reflecting member 130K covering the lateral surfaces 122c can be reflected to the upper surface 120Aa side of the light-transmitting member 120A, at least a portion of light incident on the portions of the reflecting member 130K covering the lateral surfaces 123c can be extracted from the light-emitting device 100K. That is, as in the first embodiment, light distribution in the extending direction of the first sides 121s can be further widened while having narrow light distribution in the extending direction of the second sides 122s. In this example, with the lateral surfaces 154c and 155c of the wavelength conversion member 150K covered with portions of the reflecting member 130K having a relatively great thickness, for example, white light having a further wider light distribution in the extending direction of the first sides 121s can be obtained.

As described above, the wall portions 130Kw (i.e., first portions) of the reflecting member 130K have a thickness smaller than a thickness of other portions 130Kx (also referred to as "second portions 130Kx") of the reflecting member 130K. That is, each of the first portions 130Kw has an outer lateral surface which is perpendicular to the upper surface 100a of the light-emitting device 100K and located inward of an outer lateral surface of a corresponding one of the second portions 130Kx which is perpendicular to the upper surface 100a of the light-emitting device 100K. Therefore, in this example, each of the second portions 130Kx of the reflecting member 130K has an upper surface 130xa at a position located lower than the upper surface of a corresponding one of the wall portions 130Kw which forms a portion of the upper surface 100a of the light-emitting device 100K. As can be understood from FIG. 27 and FIG. 28, the upper surfaces 130xa are located at two positions which are on the left and right sides of the light-transmitting member 120A and which are located outward of the wall portions 130Kw in a top view. In other words, in the configuration illustrated in FIG. 27 and FIG. 28, the reflecting member 130K has stepped portions 130Sp, each of which is formed by the upper surface 130xa of a corresponding one of the second portions 130Kx and a corresponding one of the wall portions 130Kw.

Each of the stepped portions 130Sp is open at the upper surface 100a of the light-emitting device 100K and at one of a pair of outer surfaces 100c of the light-emitting device 100K which are opposite to each other with the light-transmitting member 120A being located therebetween. The stepped portions 130Sp may be referred to as "recessed portions" formed in the reflecting member 130K. The "recessed portions" as used herein may or may not be formed by performing cutting to remove a portion of an element, and may be formed in any appropriate manner. For example, when employing transfer molding, a recess in a mold for transfer molding may be provided with protrusions, which may form the recessed portions. In other words, the "recessed portions" may be a portion formed so as to have a recessed shape without removing a portion of the reflecting member.

With the second portions 113Kx including the upper surface 130xa located at a position lower than the upper surface of the wall portions 130Kw, for example, at a height generally equal to a height of the lower surface of the light-transmitting member 120A, the thickness t3 of the wall portions 130Kw can easily be smaller than the thickness t5 of the second portions 130Kx. With the thickness t3 of the wall portions 130Kw smaller than the thickness t5 of the second portions 130Kx, light emitted from the light-emitting element 110 and incident on the lateral surfaces 123c of the light-transmitting member 120A can be efficiently extracted in a direction perpendicular to the lateral surfaces 123c. That is, light distribution characteristics in which light distribution in the YZ plane can be wider as compared with light distribution in the ZX plane, and light distribution in the extending direction of the first sides 121s of the light-transmitting member 120A is further widened while light distribution in the extending direction of the second sides 122s of the light-transmitting member 120A is narrow can be obtained. In the normal direction of the upper surface 120Aa of the light-transmitting member 120A, the height of the upper surface 130xa of the second portions 130Kx with respect to the height of the lower surface of the light-transmitting member 120A is, for example, in the range of ±20 μm, more preferably in the range of ±10 μm.

The upper surface 130xa of the second portions 130Kx may be located between the upper surface of the light-transmitting member 120A and the lower surface of the light-transmitting member 120A. With the upper surface 130xa located at such a position, a thickness of the second portions 130Kx of the reflecting member 130K which cover the lateral surfaces 155c of the wavelength conversion member can be easily increased. Increase in the thickness of the second portions 130Kx of the reflecting member 130K allows improvement in the effect of reducing deterioration of the wavelength conversion member attributed to entry of external moisture or the like.

In certain embodiments of the present disclosure, the reflecting member may not totally reflect light emitted from a light-emitting element. The reflecting member can include a portion having a reduced thickness that allows a portion of light emitted from the light-emitting element to be transmitted therethrough.

Figure 30:
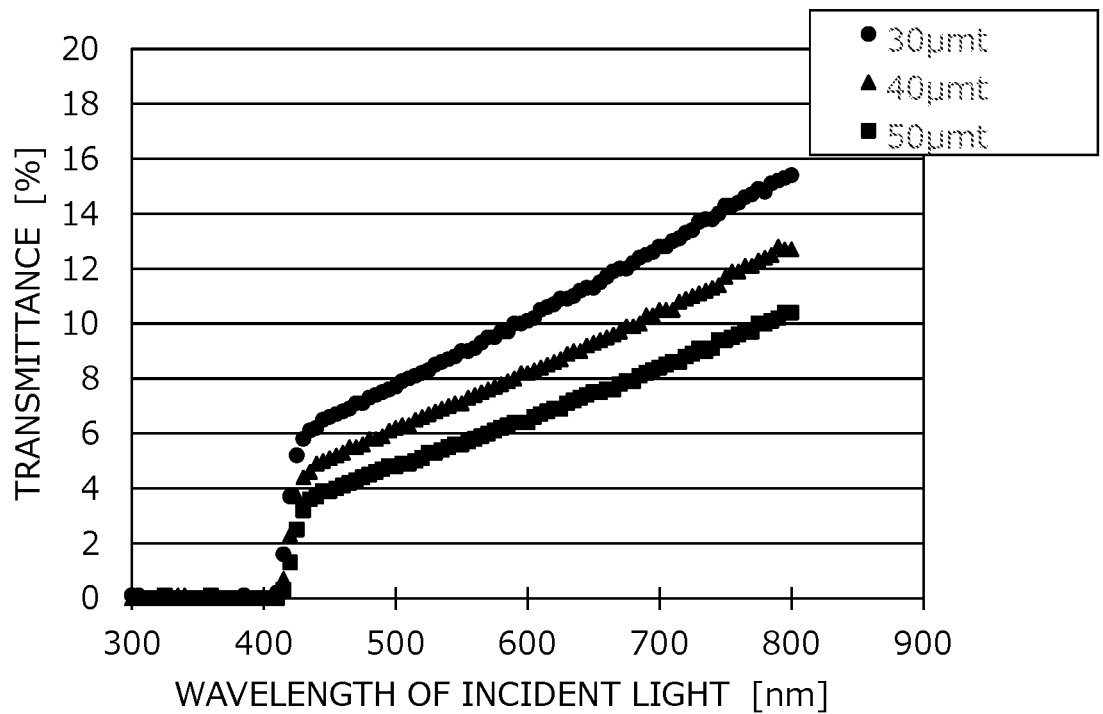
FIG. 30 is a graph showing the relationship between the thickness of the reflecting member and the transmittance of the reflecting member.

FIG. 30 shows an example of the relationship between the thickness of the reflecting member and the transmittance. FIG. 30 shows the measurement results of the transmittance of white resin sheet samples, each of which having a shape similar to the reflecting member, with different thicknesses. Herein, a resin compound in which titanium oxide particles (more specifically, CR-95 manufactured by ISHIHARA SANGYO KAISHA, LTD.) was mixed into a silicone resin (more specifically, OE7660 manufactured by Dow Corning Toray Co., Ltd.) at a weight ration of 60 wt % was molded into a sheet using a compression molding machine. The obtained resin sheet was heated in an oven to be cured. The cured sheet was ground to have a predetermined thickness, so that three samples of different thicknesses were provided. Light of varying wavelengths were perpendicularly incident on the samples, and the transmittance of each sample was measured for each of the wavelengths. In measurement of the transmittance, Spectrophotometer U-3010 manufactured by Hitachi High-Technologies Corporation was used.

As shown in FIG. 30, in a range where the wavelength is about 430 nm or greater, the smaller the thickness of the samples, the greater the transmittance of each of the samples is. For example, the transmittances for light at a wavelength of 450 nm of the samples which had a thickness of 50 μm, 40 µm and 30 µm were 3.9%, 5.1% and 6.6%, respectively. The transmittances for light at a wavelength of 630 nm of the samples which had a thickness of 50 µm, 40 µm and 30 µm were 7.1%, 8.9% and 10.9%, respectively. It can be also understood from FIG. 30 that, the greater the wavelength is, the greater the degree of increase of the transmittance according to the decrease of the sample thickness is.

As can be understood from FIG. 30, without removing an entirety of portion of the reflecting member from which light is to be extracted, reduction in the thickness of the reflecting member allows for extracting light from the light-emitting device. The thickness of the reflecting member can be appropriately selected according to a transmittance and the composition of the material of the reflecting member to be obtained.

Figure 31:
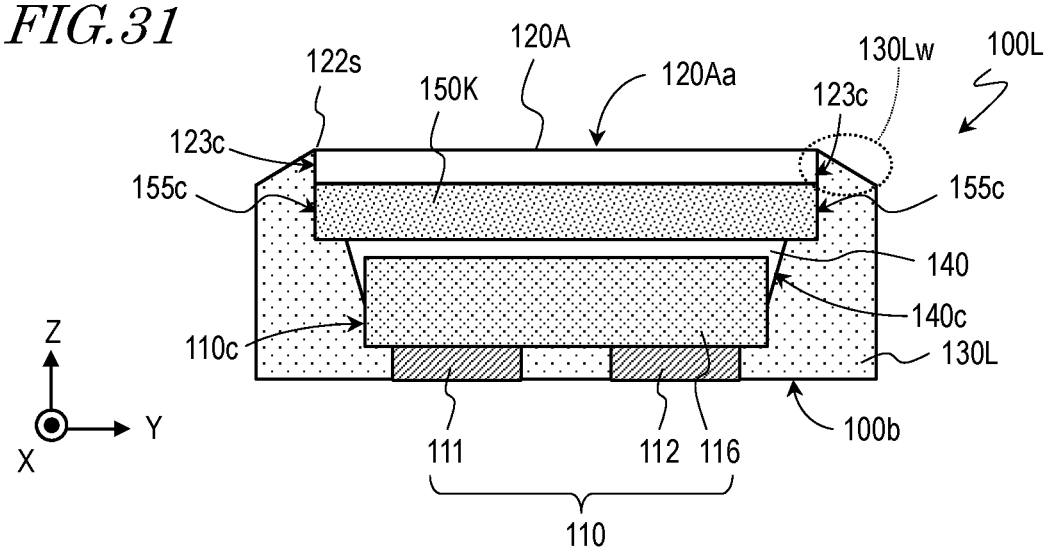
FIG. 31 is a schematic cross-sectional view showing another example of the light-emitting device of the second embodiment of the present disclosure.

FIG. 31 shows another example of the light-emitting device of the second embodiment of the present disclosure. FIG. 31 is a schematic cross-sectional view which corresponds to the YZ cross-sectional view shown in FIG. 28.

The light-emitting device 100L shown in FIG. 31 includes a reflecting member 130L. The reflecting member 130L includes wall portions 130Lw that cover the lateral surfaces 123c of the light-transmitting member 120A. In the configuration illustrated in FIG. 31, the wall portions 130Lw have a shape in which the thickness gradually decreases in an upward direction away from the lower surface 100b side of the light-emitting device 100L. Thus, the thickness of portions of the reflecting member 130L covering the lateral surfaces 123c of the light-transmitting member 120A may not be uniform along the upper-lower direction of the light-emitting device 100L. The reflecting member 130L includes, on the lateral surfaces 123c, at least portions having a thickness smaller than the portions of the reflecting member 130L covering the lateral surfaces 155c of the wavelength conversion member 150K. In this example, light can be emitted from parts of the wall portions 130Lw near the upper surface 120Aa of the light-transmitting member 120A.

Figure 32:
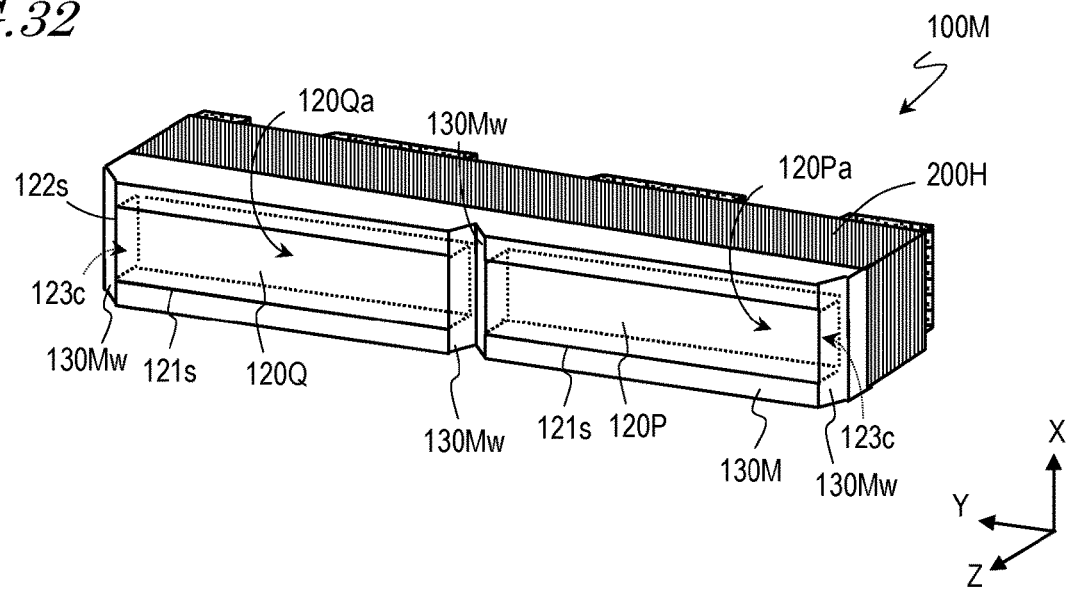
FIG. 32 is a schematic perspective view of still another variant example of the light-emitting device of the second embodiment of the present disclosure when viewed from the front side.
Figure 33:
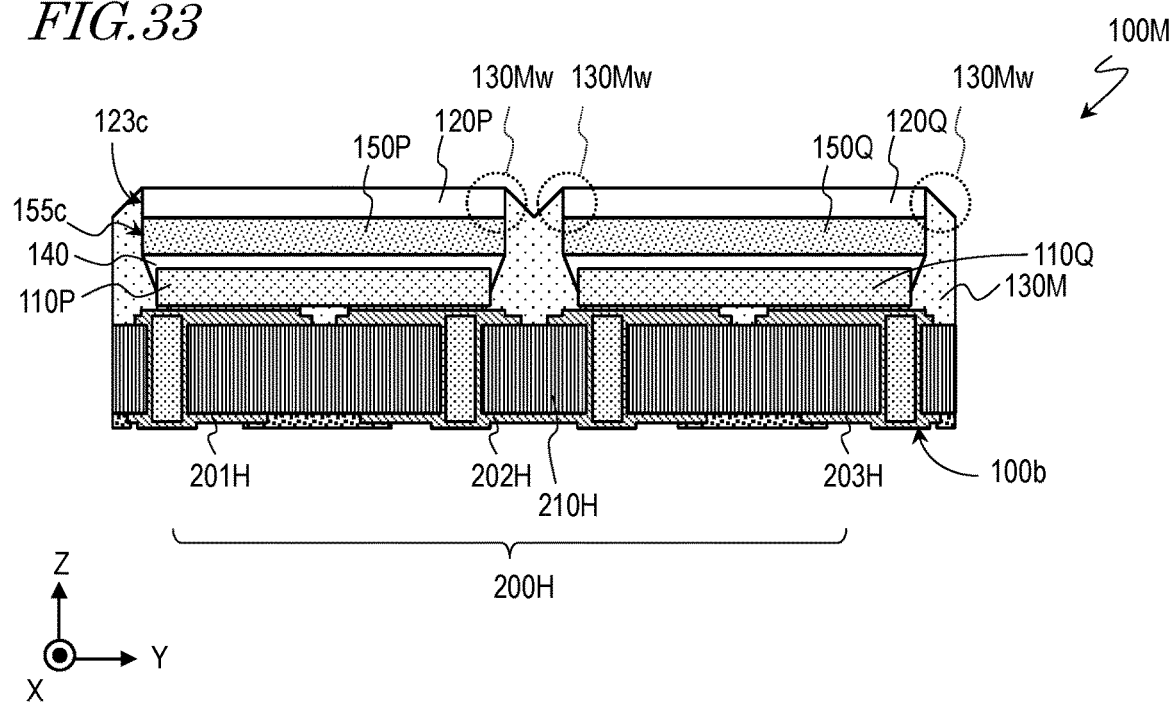
FIG. 33 is a schematic cross-sectional view of the light-emitting device 100M shown in FIG. 32 taken along a plane parallel to the YZ plane at a position near the center of the light-emitting device 100M.

FIG. 32 and FIG. 33 show still other variant examples of the light-emitting device according to the second embodiment of the present disclosure. FIG. 33 schematically shows a cross section of the light-emitting device 100M shown in FIG. 32 taken along a plane parallel to the YZ plane at a position near the center of the light-emitting device 100M.

The light-emitting device 100M shown in FIG. 32 includes a substrate 200H and light-transmitting members 120P and 120Q as in the example that has been described with reference to FIG. 21, FIG. 22 and FIG. 23, and includes a light-emitting element 110P and a light-emitting element 110Q as shown in FIG. 33.

As illustrated in this example, the light-emitting device according to the second embodiment may also include two or more light-emitting elements and may include a substrate having conductive parts connected with the light-emitting element. In the configuration illustrated in FIG. 32 and FIG. 33, the light-emitting device 100M includes a reflecting member 130M. The light-emitting device 100M includes two light-transmitting members 120P and 120Q, and accordingly the reflecting member 130M includes four wall portions 130Mw having a shape in which the thickness of the wall portions 130Mw is gradually reduced in a direction from the lower surface 100b side of the light-emitting device 100M toward the upper surface 120Pa, 120Qa side of the light-transmitting members 120P, 120Q. As schematically shown in FIG. 32 and FIG. 33, each of the walls 130Mw covers the lateral surfaces 123c of the light-transmitting member 120P or the lateral surfaces 123c of the light-transmitting member 120Q.

Example of Method of Manufacturing Light-Emitting Device

Figure 34:
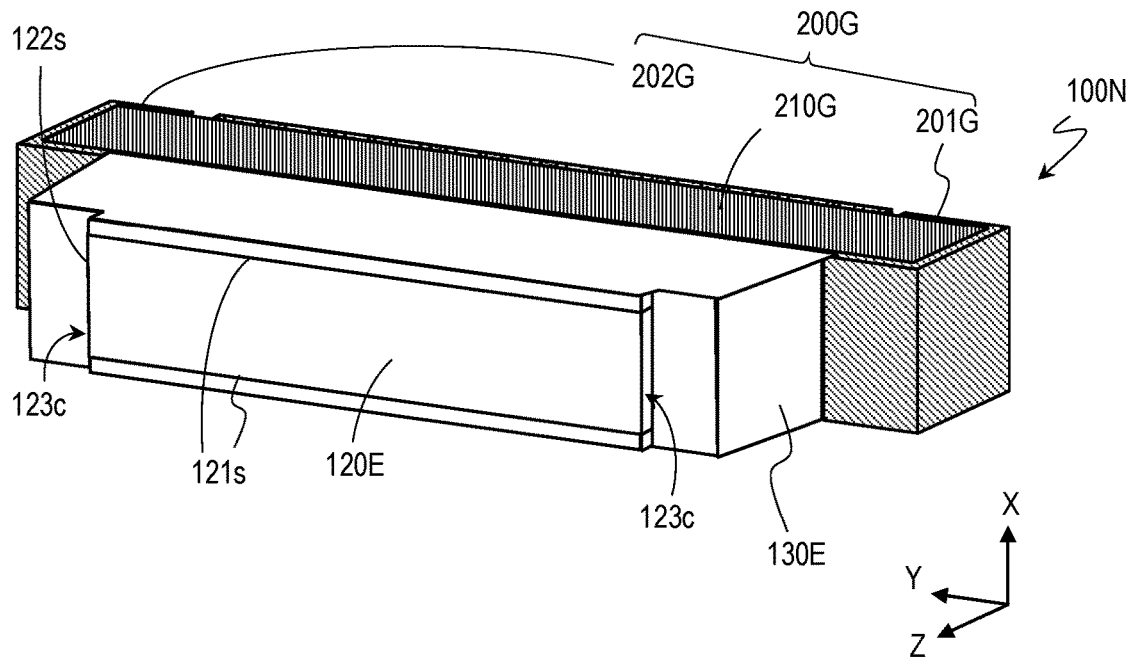
FIG. 34 is a schematic perspective view showing a light-emitting device which includes the same substrate as that of the light-emitting device described with reference to FIG. 16 and the same reflecting member as that of the light-emitting device described with reference to FIG. 10.

Next, an example of a method of manufacturing a light-emitting device according to certain embodiments of the present disclosure is briefly described. An overview of the method of manufacturing will be described below with an example of a manufacturing method of a light-emitting device 100N shown in FIG. 34. As shown in FIG. 34, the light-emitting device 100N includes a substrate 200G, as in the light-emitting device 100G shown in FIG. 16. The structure on the substrate 200G is the same as that in the light-emitting device 100E shown in FIG. 10. The lateral surfaces 123c of the light-transmitting member 120E are partially or entirely exposed out of the reflecting member 130E.

A light-emitting element 110 is provided. Herein, the upper surface 110a of the light-emitting element 110 having an oblong rectangular shape in a top view is provided. When the light-emitting device is a side-view type light-emitting device, the ratio in size between the long sides and the short sides which form the upper surface 110a can be for example, in a range of approximately 2:1 to 50:1. The light-emitting element 110 may be provided by purchasing.

Figure 35:
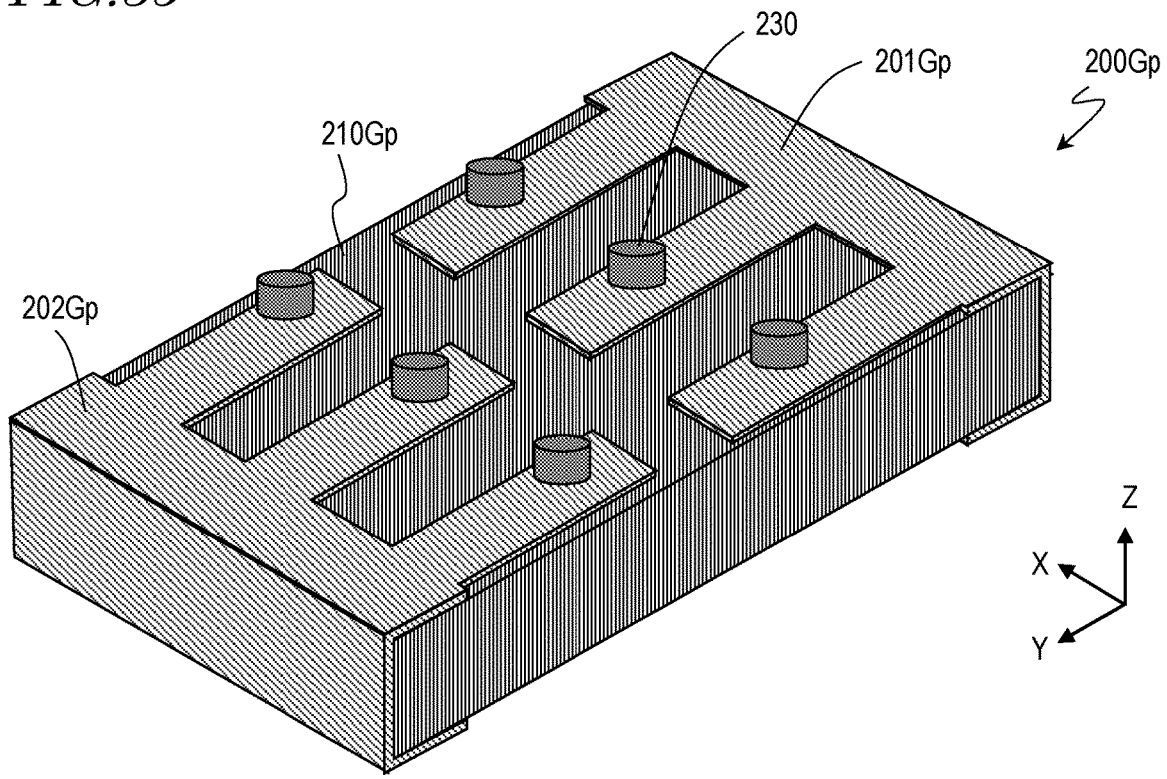
FIG. 35 is a schematic perspective view for illustration of an example of a method of manufacturing a light-emitting device according to an embodiment of the present disclosure.

Further, a substrate including conductive parts is provided. Herein, a substrate 200Gp including a main body part 210Gp, a first conductive part 201Gp, and a second conductive part 202Gp, such as shown in FIG. 35, is provided. The substrate 200Gp may also be provided by purchasing.

Figure 36:
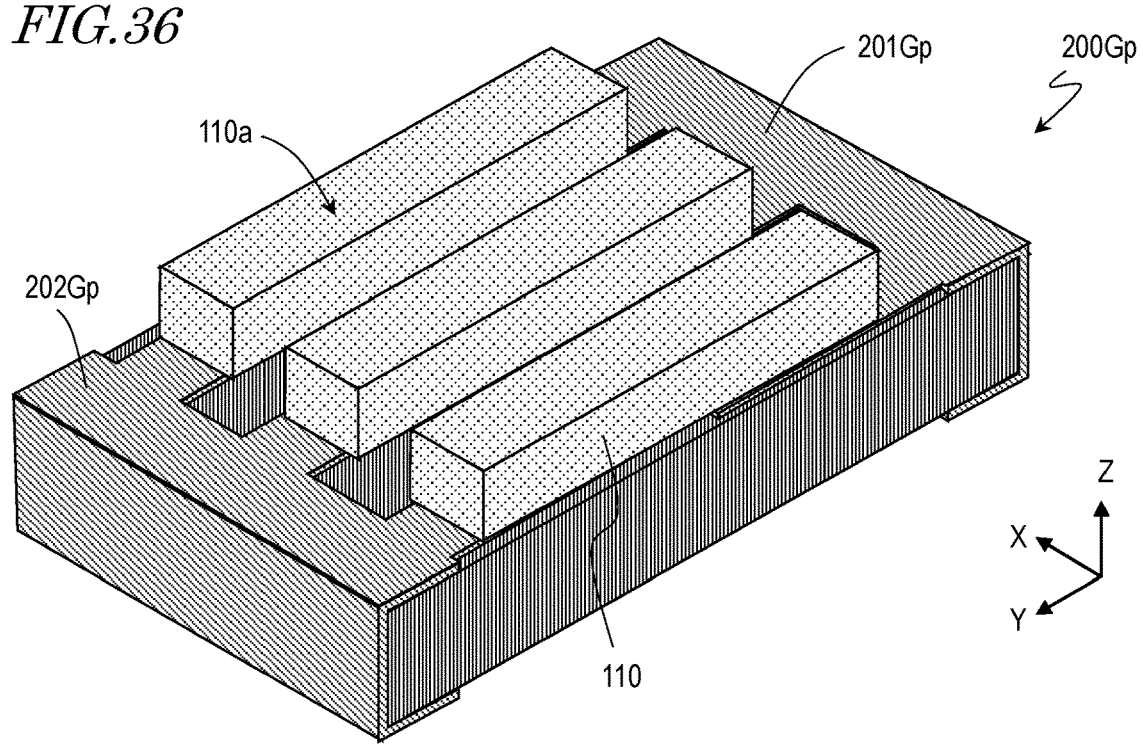
FIG. 36 is a schematic perspective view for illustration of an example of a method of manufacturing a light-emitting device according to an embodiment of the present disclosure.

Next, the light-emitting element 110 is mounted onto the substrate 200Gp. For example, solder balls made of an Au—Sn containing alloy, which serve as the bonding members 230, are placed on the first conductive part 201Gp and on the second conductive part 202Gp, and thereafter, the light-emitting element 110 is placed on the substrate 200Gp such that the first electrode 111 and the second electrode 112 are disposed on the solder balls. Thereafter, the light-emitting element 110 is bonded onto the substrate 200Gp by reflowing. Herein, as shown in FIG. 36, three light-emitting elements 110 are arranged on the substrate 200Gp along the transverse direction of the light-emitting elements 110.

Figure 37:
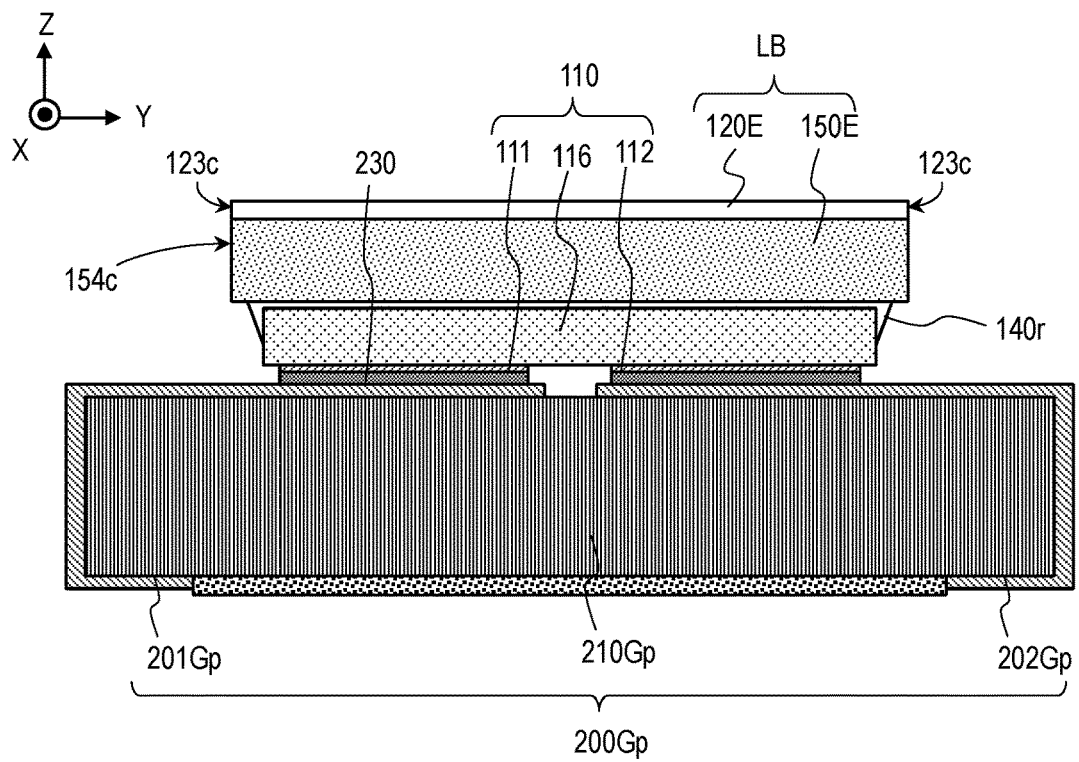
FIG. 37 is a schematic cross-sectional view for illustration of an example of a method of manufacturing a light-emitting device according to an embodiment of the present disclosure.

Then, the wavelength conversion member 150E and the light-transmitting member 120E are placed above the light-emitting element 110. For example, a transparent adhesive agent 140r is applied to the upper surface 110a of each light-emitting element 110, and as shown in FIG. 37, a multilayer structure LB including the wavelength conversion member 150E and the light-transmitting member 120E is placed on the transparent adhesive agent 140r. For example, a transparent resin sheet and a resin sheet in which phosphors are dispersed are bonded to each other by heat pressing, so that the multilayer structure LB can be formed. In a top view, the area of the multilayer structure LB may be greater than the area of the upper surface 110a to some extent. When necessary, the external shape of the multilayer structure LB may be adjusted using an abrasive disc (hereinafter, simply referred to as "blade"). Thereafter, the transparent adhesive agent 140r is cured to form a light guiding member 140.

Figure 38:
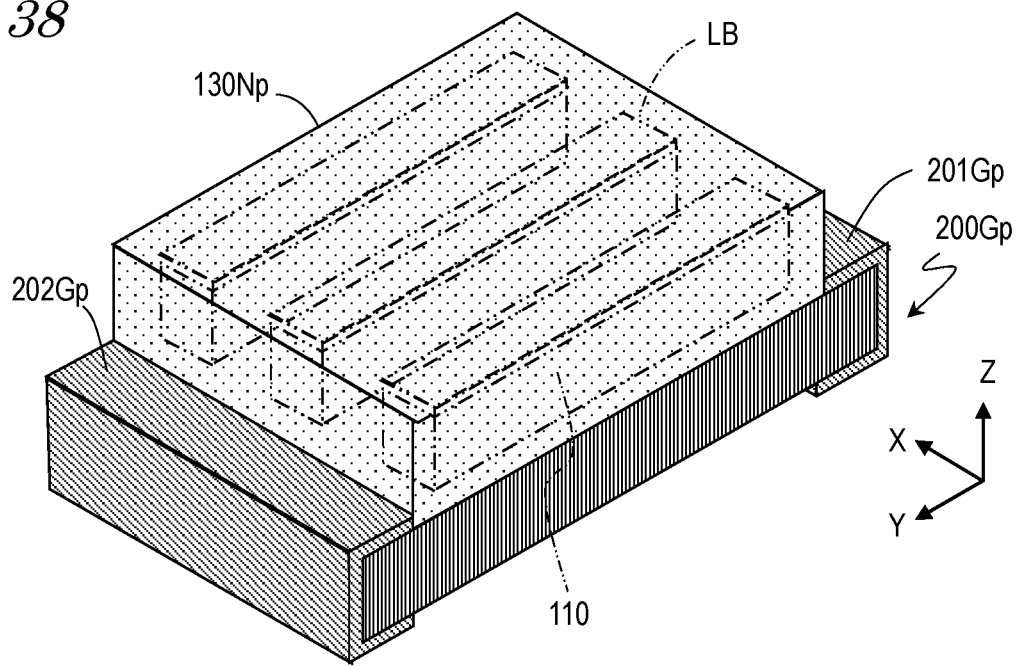
FIG. 38 is a schematic perspective view for illustration of an example of a method of manufacturing a light-emitting device according to an embodiment of the present disclosure.

Then, the structure on the substrate 200Gp is sealed with a resin material in which a reflective filler is dispersed. Herein, as shown in FIG. 38, a resin layer 130Np is formed to cover all of the three light-emitting elements 110. For formation of the resin layer 130Np, transfer molding, compression molding, or the like can be employed.

Figure 39:
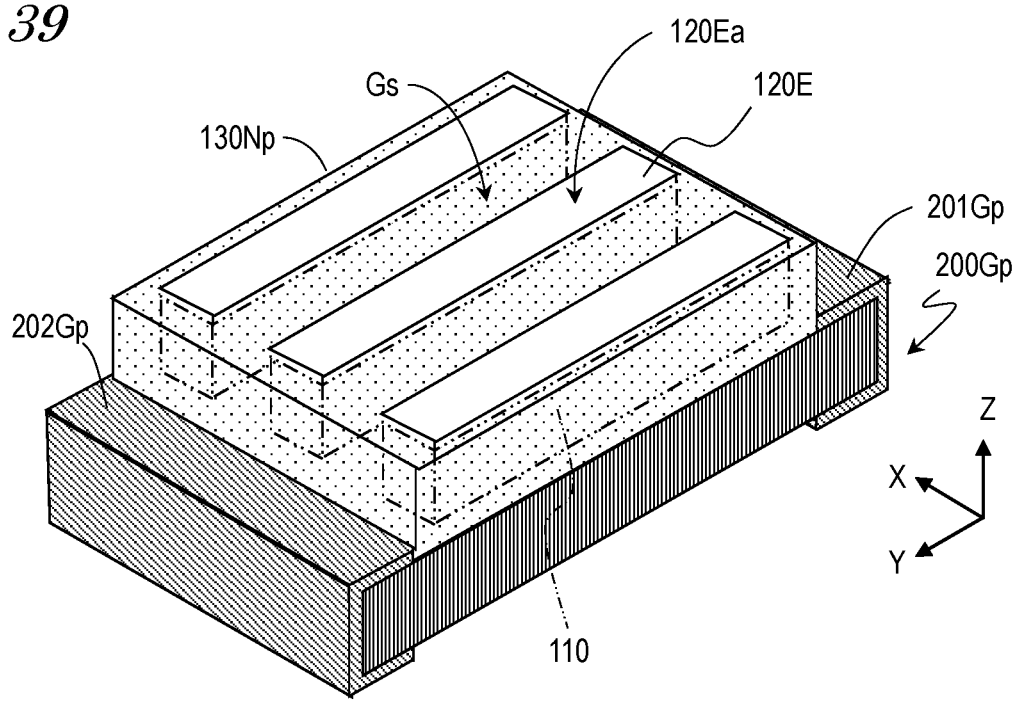
FIG. 39 is a schematic perspective view for illustration of an example of a method of manufacturing a light-emitting device according to an embodiment of the present disclosure.
Figure 40:
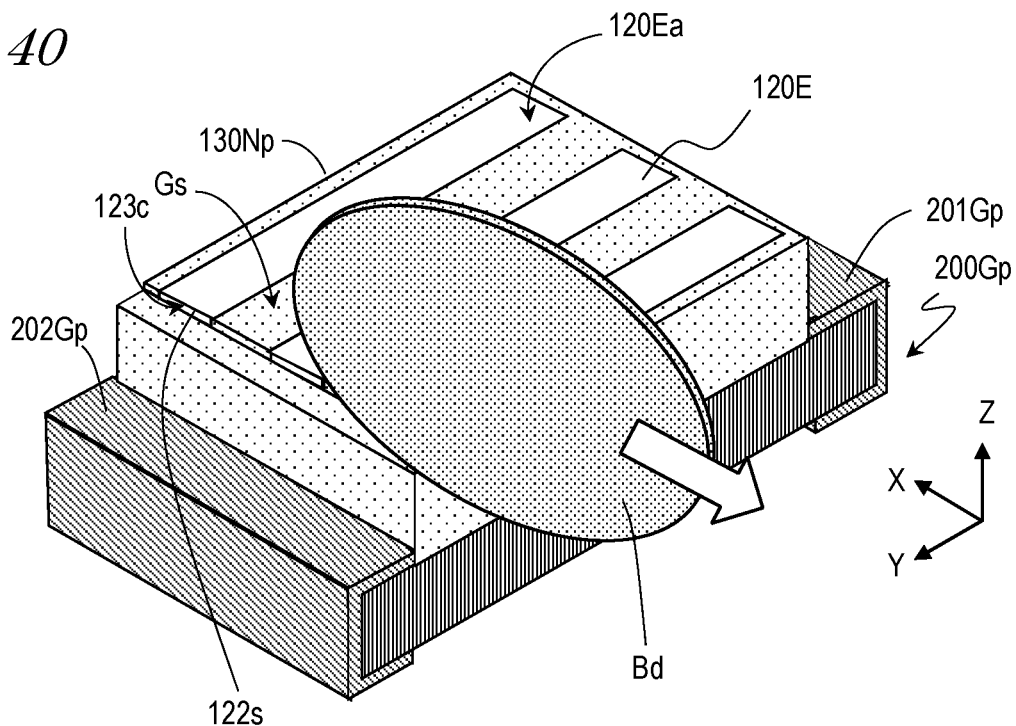
FIG. 40 is a schematic perspective view for illustration of an example of a method of manufacturing a light-emitting device according to an embodiment of the present disclosure.

Then, the resin layer 130Np is partially removed by grinding, so that the upper surface 120Ea of the light-transmitting members 120E is exposed at a ground surface Gs formed in the resin layer 130Np as shown in FIG. 39. Thereafter, as schematically shown in FIG. 40, a rotating blade Bd is driven to run in the extending direction of the second sides 122s (X-direction in FIG. 40), so that another portion of the resin layer 130Np is removed such that the lateral surfaces 123c of each of the light-transmitting members 120E can be partially or entirely exposed out of the resin layer 130Np. Examples of a technique used for exposing the lateral surfaces 123c out of the resin layer 130Np include not only a dicing technique, but also any appropriate techniques such as laser processing. Alternatively, in order to prevent the resin layer 130Np covering the lateral surfaces 123c, a mold which has protrusions extending inward of the recess may be used in the step of forming the resin layer 130Np.

Figure 41:
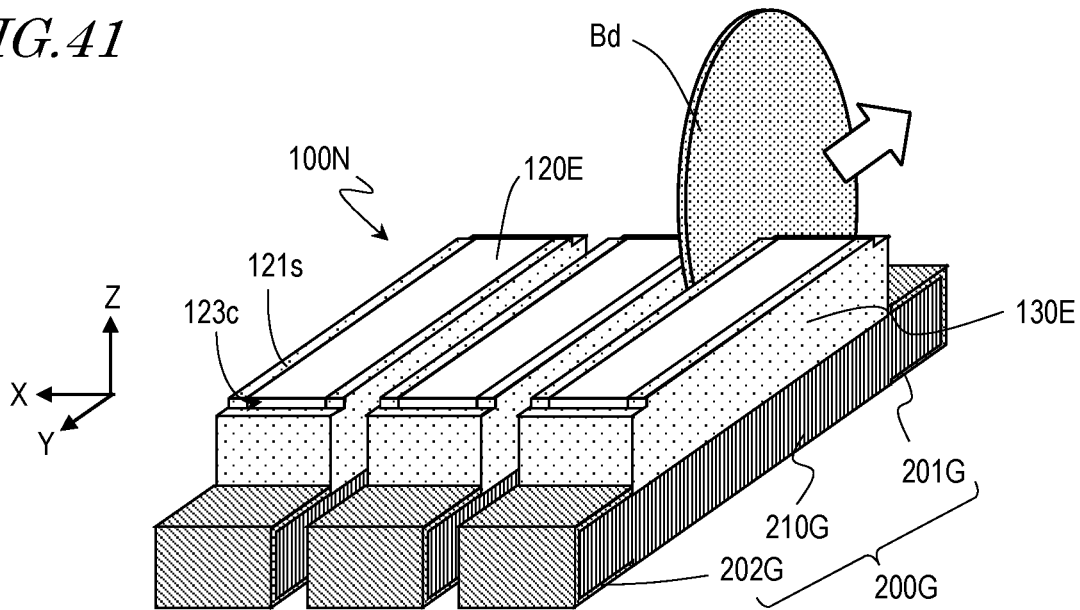
FIG. 41 is a schematic perspective view for illustration of an example of a method of manufacturing a light-emitting device according to an embodiment of the present disclosure.

Thereafter, as schematically shown in FIG. 41, the resin layer 130Np and the substrate 200Gp are cut at positions between adjoining light-emitting elements 110 by, for example, dicing, so that the light-emitting device 100N shown in FIG. 34 is obtained. Portions of the reflecting member 130E covering the lateral surfaces 122c that are perpendicular to the lateral surfaces 123c can have a thickness of, for example, approximately, more than 0 μm and not more than 100 μm. The portions of the reflecting member 130E covering the lateral surfaces 122c may have a thickness of, approximately, in a range of 5 μm to 80 μm, or in a range of 10 μm to 50 μm.

In the step of partially removing the resin layer 130Np illustrated in FIG. 40, the wall portions 130Lw such as shown in FIG. 31 or the wall portions 130Mw such as shown in FIG. 33 can be formed by using a blade with a tapered edge or by laser processing. The recessed portions 130r such as shown in FIG. 16 can be formed by using a mold which has protrusions inside the cavity or by laser processing.

Certain embodiments of the present disclosure may be employed for various light sources for illuminations, light sources for vehicles, light sources for display devices, etc. In particular, certain embodiments of the present disclosure are advantageously applicable to uses in which anisotropic light distribution is required.

While certain embodiments of the present invention have been described, it will be apparent to those skilled in the art that the disclosed invention may be modified in numerous ways and may assume many embodiments other than those specifically described above. Accordingly, it is intended by the appended claims to cover all modifications of the invention that fall within the true spirit and scope of the invention.

What is claimed is:

1. A light-emitting device comprising:
    a light-emitting element which includes an upper surface and a first lateral surface;
    a light-transmitting member disposed above the upper surface of the light-emitting element, the light-transmitting member having a substantially rectangular shape with a pair of first sides substantially parallel to each other and a pair of second sides substantially parallel to each other and substantially perpendicular to the first sides in a top view;
    a wavelength conversion member disposed between the light-emitting element and the light-transmitting member, the wavelength conversion member having a plurality of lateral surfaces; and
    a reflecting member,
    wherein the light-transmitting member has
        a pair of second lateral surfaces each including a corresponding one of the first sides of the rectangular shape of the light-transmitting member, and
        a pair of third lateral surfaces each including a corresponding one of the second sides of the rectangular shape of the light-transmitting member,
    the reflecting member covers the first lateral surface of the light-emitting element, an entirety of the plurality of lateral surfaces of the wavelength conversion member, and an entirety of the pair of second lateral surfaces of the light-transmitting member, and
    each of the pair of third lateral surfaces of the light-transmitting member is partially exposed out of the reflecting member.

2. The light-emitting device of claim 1, wherein the pair of third lateral surfaces of the light-transmitting member are entirely exposed out of the reflecting member.

3. The light-emitting device of claim 2, wherein the reflecting member has a reflecting surface opposing a portion of a third lateral surface of the light-transmitting member, said portion being exposed out of the reflecting member, the reflecting surface being inclined with respect to the third lateral surface of the light-transmitting member.

4. The light-emitting device of claim 1, wherein the reflecting member has a reflecting surface opposing a portion of a third lateral surface of the light-transmitting member, said portion being exposed out of the reflecting member, the reflecting surface being inclined with respect to the third lateral surface of the light-transmitting member.

5. The light-emitting device of claim 1, wherein
    the light-transmitting member has a substantially oblong rectangular shape in a top view,
    the first sides are longer sides of the oblong rectangular shape relative to the second sides, and
    the second sides are shorter sides of the oblong rectangular shape relative to the first sides.

6. The light-emitting device of claim 1, wherein
    the light-emitting device comprise a plurality of light-emitting elements that include a first light-emitting element and a second light-emitting element, and
    the light-emitting device comprises a plurality of light-transmitting members that include a first light-transmitting member disposed above the first light-emitting element and a second light-transmitting member disposed above the second light-emitting element, wherein the first light-transmitting member and the second light-transmitting member are spaced away from each other in an extending direction of the first sides of the substantially rectangular shape of the light-transmitting member having a substantially rectangular shape.

7. The light-emitting device of claim 6, wherein the reflecting member includes a portion located between a third lateral surface of the first light-transmitting member and a third lateral surface of the second light-transmitting member.

8. The light-emitting device of claim 1, wherein
    the light-emitting element includes a first electrode and a second electrode which are disposed on a side opposite to the upper surface, and
    the light-emitting device further comprises a substrate, the substrate including a first conductive part connected with the first electrode of the light-emitting element and a second conductive part connected with the second electrode of the light-emitting element.

9. The light-emitting device of claim 1, further comprising a light guiding member, the light guiding member including a portion located between the first lateral surface of the light-emitting element and the reflecting member.

10. A backlight comprising:
the light-emitting device as set forth in claim 1; and
a light guide plate which has two principal surfaces and a light incident surface located between the principal surfaces, the light incident surface being optically coupled with the light-emitting device,
wherein a distance between a light emission surface of the light-transmitting member and the light incident surface of the light guide plate is in a range of 0 µm to 5 µm.

11. A light-emitting device comprising:
a light-emitting element which has an upper surface and a first lateral surface;
a light-transmitting member disposed above the upper surface of the light-emitting element, the light-transmitting member having a substantially rectangular shape with a pair of first sides substantially parallel to each other and a pair of second sides substantially parallel to each other and substantially perpendicular to the first sides in a top view;
a wavelength conversion member disposed between the light-emitting element and the light-transmitting member; and
a reflecting member,
wherein, the light-transmitting member includes:
a pair of second lateral surfaces each including a corresponding one of the first sides of the rectangular shape of the light-transmitting member, and
a pair of third lateral surfaces each including a corresponding one of the second sides of the rectangular shape of the light-transmitting member,
the wavelength conversion member includes:
a pair of fourth lateral surfaces which are parallel to the second lateral surfaces of the light-transmitting member, and
a pair of fifth lateral surfaces which are parallel to the third lateral surfaces of the light-transmitting member,
the reflecting member covers the first lateral surfaces of the light-emitting element and an entirety of the second lateral surfaces of the light-transmitting member, the third lateral surfaces of the light-transmitting member, the fourth lateral surfaces of the wavelength conversion member and the fifth lateral surfaces of the wavelength conversion member, and
the reflecting member includes a first portion covering the third lateral surfaces of the light-transmitting member, and a second portion covering the fifth lateral surfaces of the wavelength conversion member, the first portion having a thickness smaller than a thickness of the second portion, and the second portion has an upper surface located outward of the first portion.

12. The light-emitting device of claim 11, wherein the first portion of the reflecting member includes a portion having a thickness that gradually decreases in an upward direction of the light-emitting device.

13. The light-emitting device of claim 11, wherein
the light-transmitting member has a substantially oblong rectangular shape in a top view,
the first sides are longer sides of the oblong rectangular shape relative to the second sides, and
the second sides are shorter sides of the oblong rectangular shape relative to the first sides.

14. The light-emitting device of claim 11, wherein
the light-emitting device comprises a plurality of the light-emitting elements that include a first light-emitting element and a second light-emitting element, and
the light-emitting device comprises a plurality of the light-transmitting members that include a first light-transmitting member disposed above the first light-emitting element and a second light-transmitting member disposed above the second light-emitting element, wherein the first light-transmitting member and the second light-transmitting member are spaced away from each other in an extending direction of the first sides of the substantially rectangular shape of the light-transmitting member having a substantially rectangular shape.

15. The light-emitting device of claim 14, wherein the reflecting member includes a portion located between a third lateral surface of the first light-transmitting member and a third lateral surface of the second light-transmitting member.

16. The light-emitting device of claim 11, wherein
the light-emitting element includes a first electrode and a second electrode which are disposed on a side opposite to the upper surface, and
the light-emitting device further comprises a substrate, the substrate including a first conductive part connected with the first electrode of the light-emitting element and a second conductive part connected with the second electrode of the light-emitting element.

17. The light-emitting device of claim 11, further comprising a light guiding member, the light guiding member including a portion located between the first lateral surface of the light-emitting element and the reflecting member.

18. A backlight comprising:
the light-emitting device as set forth in claim 11; and
a light guide plate which has two principal surfaces and a light incident surface located between the principal surfaces, the light incident surface being optically coupled with the light-emitting device,
wherein a distance between a light emission surface of the light-transmitting member and the light incident surface of the light guide plate is in a range of 0 µm to 5 µm.

* * * * *